(12) United States Patent
Ishikawa et al.

(10) Patent No.: US 6,850,313 B2
(45) Date of Patent: Feb. 1, 2005

(54) EXPOSURE METHOD, EXPOSURE APPARATUS AND ITS MAKING METHOD, DEVICE MANUFACTURING METHOD, AND DEVICE

(75) Inventors: Jun Ishikawa, Ohi-machi (JP); Hiroyuki Nagasaka, Sagamihara (JP); Naomasa Shiraishi, Urawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/435,031

(22) Filed: May 12, 2003

(65) Prior Publication Data

US 2003/0197849 A1 Oct. 23, 2003

Related U.S. Application Data

(63) Continuation of application No. 09/672,307, filed on Sep. 29, 2000, now abandoned.

(30) Foreign Application Priority Data

Oct. 1, 1999 (JP) .......................................... 11-281671
Oct. 5, 1999 (JP) .......................................... 11-284940

(51) Int. Cl.[7] .......................... G03B 27/72; G03B 27/54
(52) U.S. Cl. ........................................ 355/69; 355/67
(58) Field of Search ................................ 250/205, 216, 250/559.3, 548; 356/399–401; 355/30, 68–71, 77, 53, 55, 67

(56) References Cited

U.S. PATENT DOCUMENTS

| | | | |
|---|---|---|---|
| 4,440,489 A | 4/1984 | Yuasa | |
| 4,701,606 A | 10/1987 | Tanimoto et al. | |
| 4,704,027 A | * 11/1987 | Phillips | 355/43 |
| 4,929,083 A | 5/1990 | Brunner | |
| 5,081,635 A | 1/1992 | Wakabayashi et al. | |
| 5,291,240 A | * 3/1994 | Jain | 355/53 |
| 5,559,584 A | 9/1996 | Miyaji et al. | |
| 5,892,573 A | * 4/1999 | Takahashi et al. | 355/61 |
| 5,898,477 A | 4/1999 | Yoshimura et al. | |
| 6,268,904 B1 | * 7/2001 | Mori et al. | 355/53 |
| 6,366,341 B1 | 4/2002 | Shirato et al. | |
| 6,414,743 B1 | 7/2002 | Nishi et al. | |

FOREIGN PATENT DOCUMENTS

| | | |
|---|---|---|
| EP | 0 445 871 A1 | 9/1991 |
| EP | 1 039 510 A1 | 9/2000 |
| JP | 62-204527 | 9/1987 |
| JP | 05-343288 | 12/1993 |

* cited by examiner

Primary Examiner—Rodney Fuller
Assistant Examiner—Andrew Sever
(74) Attorney, Agent, or Firm—Oblon, Spivak, McClelland, Maier & Neustadt, P.C.

(57) ABSTRACT

The energy amount of the energy beam passing through the illumination optical system is detected with the first photosensor, whereas the energy amount of the energy beam EL passing through at least a portion of the projection optical system PL is detected. And in accordance with the detection results, the main controller controls the exposure amount provided on the substrate during exposure. In the case the transmittance of the energy beam in the optical path from the first photosensor to the substrate surface (image plane) changes, this change is substantially precisely reflected to a value obtained by dividing the detection value of the second photosensor by the detection value of the first photosensor and normalizing the result. Accordingly, the transmittance change of the optical system in the optical path can be substantially cancelled out, allowing an exposure amount control with high precision.

41 Claims, 10 Drawing Sheets

EXPOSURE METHOD, EXPOSURE APPARATUS AND ITS MAKING METHOD, DEVICE MANUFACTURING METHOD, AND DEVICE

This application is a CON of 09/672,307 filed Sep. 29, 2000 now abandon

BACKGROUND OF THE INVENTION

1. Field of the Invention

The present invention relates to an exposure method, an exposure apparatus and its making method, a device manufacturing method, and a device. More particularly, the present invention relates to an exposure method used to manufacture semiconductor devices and liquid crystal display devices and the like in a lithographic process, an exposure apparatus used in the exposure method and its making method, a device manufacturing method using the exposure method and exposure apparatus, and a device manufactured by the method.

2. Description of the Related Art

Conventionally, in a lithographic process to manufacture devices such as semiconductor devices (CPU, DRAM, and the like), pickup devices (CCD), liquid crystal display devices, and thin film magnetic heads, various exposure apparatus has been used to form a device pattern onto a substrate. In recent years, with the degree of integration of semiconductor devices increasing, the reduction projection exposure apparatus based on the step-and-repeat method (usually referred to as steppers) and a scanning exposure apparatus which is an improvement of the stepper based on a step-and-scan method have become mainstream. These types of apparatus can form a fine pattern onto a substrate such as a wafer or a glass plate (to be generally referred to as a "substrate" or a "wafer" hereinafter) with high throughput.

With these types of projection exposure apparatus, when the amount of exposure light irradiated on the wafer surface (exposure amount) exceeds or is less than the appropriate amount, the line width of the pattern formed may vary. This does not allow a pattern having a desirable line width to be formed, which in turn may lead to the electronic device which is the final product to be a defect. Accordingly, with these types of apparatus, the exposure amount irradiated onto the wafer surface needs to be controlled so that it becomes an appropriate amount.

With the conventional projection exposure apparatus, the relationship between the energy amount of the exposure light which passes through the illumination optical system (hereinafter referred to as "energy amount within the illumination system" for the sake of convenience) and the energy amount of the exposure light which is irradiated on the wafer surface, in other words the image plane (hereinafter referred to as "image plane energy amount" for the sake of convenience) was obtained in advance. And in accordance with the relationship, the conversion factor (or the conversion function) referred to as an $\alpha$ value, to convert the energy amount within the illumination system to the image plane energy amount was determined. Then, on actual exposure, the energy amount within the illumination system was detected by using an optical sensor called an integrator sensor, and based on the detection result and the value (or the conversion function) the image plane energy amount was calculated. And according to the calculation result, exposure amount control of the exposure light irradiated onto each point on the wafer was performed so that the exposure amount was set at an appropriate level.

Meanwhile, the degree of integration of semiconductor devices is becoming higher year by year, and thus demand for exposure apparatus that has a higher resolution is increasing. As a method of improving the resolution of the projection exposure apparatus such as the stepper, increasing the numerical aperture (N. A.) of the projection optical system or shortening the exposure wavelength of the exposure light is typical. However, since increasing the number of numerical apertures limits the depth of focus, the most effective method is considered to be shortening the exposure wavelength.

With the projection exposure apparatus, as the demand for a higher resolution increases, light source which emit light of a shorter wavelength is being used more often as a light source. Recently, as a light source succeeding the krypton fluoride excimer laser (KrF excimer laser), an argon fluoride excimer laser (ArF excimer laser) having an output wavelength of 193 nm has received attention, and using the ArF excimer laser as a light source in an exposure apparatus is now in the stage of practical use. If the argon fluoride excimer laser is used as the exposure light source, it is said that mass production of microdevices having fine patterns with a device rule of 0.18 $\mu$m to 0.13 $\mu$m would be possible.

When using light of a short wavelength such as the ArF excimer laser as the exposure light, the exposure light being absorbed by atmospheric materials, and the transmittance of the exposure light changing with the elapse of time caused by contaminants adhered to the respective lenses, were considered as problems. Recent researches, though, have confirmed that the transmittance of the optical system such as the projection optical system changed with the elapse of time at a level that cannot be neglected. The so-called cleaning effect can be considered as one of the causes for such a change, and such a cleaning effect is also assumed to have occurred in the case of a KrF excimer laser beam so the properties is clear to some extent. However, in actual, it is difficult to explain the temporal variation of the transmittance described above solely by the cleaning effect. Accordingly, at this point, it is difficult to predict the transmittance variation with high accuracy.

This means, that to obtain the actual amount of light reaching the wafer surface, it is not sufficient enough to only monitor the amount of light (energy amount within the illumination system) using the integrator sensor on the optical path of the illumination system. That is, the conventional method of controlling the exposure amount will most likely fall apart in the near future, due to the fact that the conventional method stood up only on the premise that the transmittance of the optical system (mainly the projection optical system) arranged between the integrator sensor and the image plane (wafer surface) is invariable.

For these reasons, development of a new technology is pressing to control the exposure amount with high precision even if the light source of the exposure apparatus is a light source that emits a light with a wavelength in the vacuum ultraviolet region.

To cope with the transmittance variation described above various attempts are being made. For example, each time the wafer is exchanged, the wafer stage holding the wafer is moved so that an optical sensor called an irradiation amount monitor arranged on the wafer stage comes to a position immediately under the projection optical system. Then, by performing simultaneous measurement with the irradiation amount monitor and the integrator sensor, the transmittance (and the variation) of the optical path on exposure is measured. And, based on the transmittance obtained, the exposure amount is adjusted while correcting the conversion factor described above.

This transmittance measurement, however, cannot be performed unless the wafer stage is moved so that the optical sensor called an irradiation amount monitor comes to a position immediately under the projection optical system, whereas, exposure is performed with the wafer at the position under the projection optical system. Therefore, to perform the simultaneous measurement is time consuming, resulting in a decrease in throughput.

Also, in future, to comply with light of a shorter wavelength, a projection exposure apparatus using a light source emitting the $F_2$ laser beam (wavelength: 157 nm) as the light source will be emerging. Light having this wavelength is greatly absorbed by atmospheric materials. Therefore, when using this light as the exposure light, the optical path needs to be uniformly filled with inert gas to the exposure light, however, it is not that simple to keep the uniformity of the inert gas with the elapse of time. And, the temporal change of the transmittance of the lens coating material within a short period is also a concern. As can be seen, therefore, the temporal change of transmittance of the exposure light needs to be clearer compared to the conventional exposure apparatus. To cope with this situation, it can be assumed that the light amount reaching the image plane (image plane energy amount) needs to be monitored at all times, and not only when the wafer is exchanged. In the conventional method, however, the light amount reaching the image plane could not be measured unless the wafer stage was moved so as to position the irradiation amount monitor immediately under the projection optical system.

SUMMARY OF THE INVENTION

The present invention has been made in consideration of this situation, and has as its first object to provide an exposure method and an exposure apparatus that can achieve exposure amount control with higher accuracy.

It is the second object of the present invention to provide a device manufacturing method that improves the productivity when manufacturing microdevices with high integration.

According to the first aspect of the present invention, there is provided a first exposure method in which an energy beam irradiates a mask having a pattern formed via an illumination optical system to transfer the pattern onto a substrate via an projection optical system, the exposure method comprising: monitoring respectively when the pattern is transferred onto the substrate via the projection optical system a first energy amount of the energy beam which passes through an inner portion of the illumination system and a second energy amount of the energy beam which has passed through at least a portion of the projection optical system; and controlling an energy amount provided to the substrate in accordance with a result of the monitoring.

According to this method, on transferring the pattern onto the substrate via the projection optical system, the first energy amount and the second energy amount are respectively monitored while the energy amount provided to the substrate is controlled in accordance with the monitored results. The first energy amount, in this case, is the energy amount of the energy beam passing through the inner portion of the illumination optical system, whereas the second energy amount is the energy amount of the energy beam having passed through at least a portion of the projection optical system. When the transmittance of the energy beam in the optical path from the detection point of the first energy amount to the substrate surface (image plane) changes, this change is almost precisely reflected to the value obtained by dividing the second energy amount by the first energy amount and normalizing the result. That is, when the first energy amount is constant, when the second energy amount changes this change substantially reflects the change of transmittance in the optical path of the energy beam. According to the present invention, therefore, the exposure amount provided to the substrate during exposure is controlled based on the monitoring results of the first energy amount and second energy amount. As a consequence, the transmittance change in the optical path from the inner portion of the illumination optical system to the substrate surface (image plane) is substantially cancelled out, thus allowing exposure amount control with high precision.

In this case, the method may further comprise: detecting a third energy amount of the energy beam irradiated on an image plane of the projection optical system almost simultaneously with the first and second energy amount; and repeating calibration of a conversion coefficient to convert a result of the first energy amount into an energy amount provided on the image plane during exposure at a predetermined timing in accordance with results of the detecting. In such a case, calibration to calibrate the conversion coefficient is repeatedly performed at a predetermined timing. Accordingly, energy amount adjustment that takes into consideration changes in the conversion coefficient which occur over a long period time and cannot be corrected by the relationship between the detection results of the first and second energy amount becomes possible. As a result, a more precise exposure amount control can be achieved.

According to the second aspect of the present invention, there is provided a second exposure method in which an energy beam emitted from a light source irradiates a mask having a pattern formed to transfer the pattern onto a substrate via an projection optical system by synchronously moving the mask and the substrate, the exposure method comprising: measuring a first energy amount of the energy beam which passes through an illumination optical path from the light source to the mask by using a first photosensor; measuring a second energy amount of the energy beam which has passed through at least a portion of the projection optical system when the mask and the energy beam have a predetermined positional relationship by using a second photosensor; and transferring the mask pattern onto the substrate by adjusting an energy provided to the substrate based on a measurement value of the first photosensor in consideration of a measurement value of the second photosensor.

According to this method, the first energy amount of the energy beam that passes through an illumination optical path from the light source to the mask is measured with the first photosensor. And when the mask and the energy beam has a predetermined positional relationship, the second energy amount of the energy beam which has passed through at least a portion of the projection optical system is measured with the second photosensor. Then, in consideration of the measurement value of the second photosensor, the pattern of the mask is transferred onto the substrate by adjusting the energy amount provided to the substrate based on the measurement value of the first photosensor.

The transmittance change of the energy beam in the optical path from the first photosensor to the substrate surface (image plane), is almost precisely reflected to the value obtained by dividing the measurement value of the second photosensor by the measurement value of the first photosensor and normalizing the result. According to the present invention, the exposure amount provided to the substrate during exposure is controlled based on the measurement value of the first photosensor with consideration of the measurement value of the second sensor. As a consequence, the influence of the transmittance change of the energy beam in the optical path can be suppressed, allowing exposure amount control with high precision, which in turn allows exposure with high precision.

In this case, the method can further comprise: measuring the second energy amount of the energy beam by the second photosensor which positional relationship between the mask and the energy beam is identical as of when the second energy amount is previously measured, wherein a result of the measuring is used to update the measurement value of the second photosensor which is used in the transfer of the mask pattern. In such a case, the measurement with the second photosensor to update the second energy amount is performed in a state where the energy beam is irradiated on the same area on the same mask as of when the previous measurement of the second energy amount by the second photosensor was performed. Therefore, even if the transmittance or reflectance of the mask differs depending on position, the measured values can be updated with high accuracy without being affected by the difference. In this case, the updated measurement value of the second photosensor substantially precisely reflects the transmittance change of the optical system.

In this case, the measurement value of the second photosensor may be updated when the mask and the substrate are moving. In such a case, when the mask and substrate is moving, for example, during synchronous movement or before or after the synchronous movement, the measurement value of the second photosensor can be updated. Therefore, the update of the measurement value of the second photosensor can be performed without reducing the throughput.

Also, in this case, the measurement value of the second photosensor can naturally be updated in accordance only with the measurement value of the second photosensor obtained in the latest exposure. However, the measurement value of the second photosensor may be updated by using a weighted average value of the measurement value of the second photosensor, the weighted average value being obtained from a plurality of exposures performed most recently.

According to the second exposure method in the present invention, the method can further comprise: setting a positional relationship between the mask and the energy beam which differs from when the second energy amount is previously measured, and measuring the second energy amount of the energy beam by the second photosensor, wherein the measurement value of the second photosensor which is used to transfer the mask pattern is updated in accordance with a result of measuring the second energy amount and a correlation value of an incident/outgoing energy amount of the mask which corresponds to a positional relationship between the mask and the energy beam at the time of measuring the second energy amount.

The term "a correlation value of an incident/outgoing energy amount of the mask" refers to a value related to the relationship between the energy amount of the energy beam irradiated onto the mask and the energy amount of the energy beam outgoing from the mask. This concept includes the transmittance in the case of a transmittance type mask, the reflectance in the case of a reflection type mask, and the percentage of chromium in the case of a mask on which chromium is used to form a pattern on a glass substrate, and the like. In this description, the term "a correlation value of an incident/outgoing energy amount of the mask" is used so as to express such a concept.

In such a case, measurement of the second energy amount of the energy beam by the second photosensor to update the measurement value is performed in a state where the energy beam is irradiated on a area different from when the measurement of the second energy amount by the second photosensor was previously performed. When the measurement value of the second photosensor is updated, the correlation value of an incident/outgoing energy amount of the mask corresponding to the area on the mask where the energy beam is irradiated is used. Consequently, even in the case when the transmittance and the like of the mask differs depending on position, a highly precise update of the measurement value of the second photosensor can be performed without substantially being affected by the difference. Furthermore, in the case when the measurement value of the second photosensor is updated by also using the correlation value of an incident/outgoing energy amount of the mask, it is possible to set the positional relationship of the mask and the energy beam the same as that of the previous measurement, and use the result of the second photosensor measuring the second energy amount of the energy beam.

In this case, the measurement value of the second photosensor can be updated when the mask and the substrate are moving. In such a case, when the mask and substrate is moving, for example, during synchronous movement or before or after the synchronous movement, the measurement value of the second photosensor can be updated. Therefore, the update of the measurement value of the second photosensor can be performed without reducing the throughput.

Also, in this case, the measurement value of the second photosensor can naturally be updated in accordance only with the measurement value of the second photosensor obtained in the latest exposure. However, the measurement value of the second photosensor may be updated by using a weighted average value of the measurement value of the second photosensor, the weighted average value being obtained from a plurality of exposures performed most recently.

With the second exposure method according to the present invention, a conversion coefficient to assume an illuminance on an image plane may be corrected based on a measurement value of the first photosensor in consideration of a measurement value of the second photosensor when adjusting the energy provided on the substrate.

With the second exposure method according to the present invention, the method can further comprise: measuring the first energy amount of the energy beam by using the first photosensor; measuring the second energy amount of the energy beam by using the second photosensor; and measuring a third energy amount of the energy beam irradiated on an image plane of the projection optical system by using a third photosensor; wherein the measuring by the first, second, and third photosensors are performed simultaneously at a predetermined timing. In such a case, the relationship of the measurement values of the respective photosensors can be calibrated at a predetermined timing. Accordingly, a more highly precise exposure amount control can be performed, correcting assumption errors of the illuminance (energy amount) on the image plane assumed from the measurement value of the first photosensor that occur over a long period time and cannot be corrected by the relationship between the measurement values of the energy amount of the first and second photosensors.

According to the third aspect of the present invention, there is provided a first exposure apparatus which transfers a pattern formed on a mask onto a substrate, the exposure apparatus comprising: an illumination optical system which irradiates an energy beam on the mask; a projection optical system which projects an outgoing energy beam from the mask onto the substrate; a first photosensor which detects an energy amount of the energy beam which passes through an inner portion of the illumination optical system; a second photosensor which detects an energy amount of the energy beam which has passed through at least a portion of the projection optical system; and an exposure amount control unit which controls an exposure amount provided to the substrate during exposure in accordance with detection results of the first and second photosensors.

With this exposure apparatus, the energy amount of the energy beam passing through the inner portion of the illumination optical system is detected by the first photosensor. The energy amount of the energy beam passing through at least a portion of the projection optical system is detected by the second photosensor. And the exposure amount control unit controls the exposure amount provided on the substrate during exposure based on both of the detection results. When the transmittance of the energy beam in the optical path from the first photosensor to the substrate surface (image plane) changes, this change is almost precisely reflected to the value obtained by dividing the detection value of the second photosensor by the detection value of the first photosensor and normalizing the result. That is, when the detection value of the first photosensor is constant, when the detection value of the second photosensor changes this change substantially reflects the change of transmittance in the optical path of the energy beam. According to the present invention, therefore, the exposure amount provided to the substrate during exposure is controlled based on the detection values of the first and second photosensors. As a consequence, the transmittance change in the optical path is substantially cancelled out, thus allowing exposure amount control with high precision.

Also, according to the first exposure apparatus of the present invention, the energy amount of the energy beam can be detected by the first and second photosensors at all times, even when the pattern is being transferred onto the substrate. And the exposure amount control can be performed based on these detection results. Therefore, a more precise exposure amount control becomes possible, compared with the case when the exposure amount control is performed based on prediction of the transmittance change of the optical system during exposure.

In this case, the exposure amount control unit can correct a conversion coefficient to convert a detection result of the first photosensor into the energy amount provided to the substrate in accordance with the detection results of the first and second photosensors. In such a case, as described earlier, when the transmittance of the energy beam in the optical path from the first photosensor to the substrate surface (image plane) changes, this change is almost precisely reflected to the value obtained by dividing the detection value of the second photosensor by the detection value of the first photosensor and normalizing the result. Therefore, by using this value to correct the conversion coefficient, the energy amount on the substrate can be accurately obtained without a complex calculation similar to the conventional art. The exposure amount, thus, can be controlled precisely using the detection value of the first photosensor and the corrected conversion coefficient.

With the first exposure apparatus according to the present invention, the second photosensor may detect an energy amount which corresponds to an energy beam irradiated onto an optical element among a group of optical elements which structure the projection optical system, the optical element optically nearest to an image plane of the projection optical system. In such a case, optical elements that may cause a change in transmittance of the energy beam do not exist on the optical path between the second photosensor and the image plane. Therefore, the value obtained by the detection value of the second photosensor divided by the detection value of the first photosensor and normalized reflects the change in transmittance of the energy beam in the optical path more accurately, thus allows a more highly precise exposure amount control.

With the first exposure apparatus according to the present invention, a low absorptive gas may be purged in an optical path of the energy beam, the optical path from the light source to a surface of the substrate. In such a case, the absorption of the energy beam along the optical path can be suppressed; therefore, decrease in transmittance of the energy beam along the optical path can be prevented.

With the first exposure apparatus according to the present invention, the energy beam may be a beam in a vacuum ultraviolet region having a wavelength not exceeding 200 nm. Light in such a wavelength region can cope with the requirement for higher resolution due to finer semiconductor integrated circuits. Furthermore, since such light is greatly absorbed by absorptive gas such as oxygen, the effect to suppress absorption when a low absorptive gas is purged in the optical path is extremely large. Also, it is not easy to keep the gas even temporally. With the present invention, however, the value reflecting the change in transmittance during exposure can be monitored almost precisely, and a highly accurate exposure amount control is possible even is the evenness is not so tightly controlled, thus does not cause a serious problem.

According to the fourth aspect of the present invention, there is provided a second exposure apparatus which energy beam irradiates a mask having a pattern formed and transfers the pattern onto a substrate while synchronously moving the mask and the substrate, the exposure apparatus comprising: a light source which emits the energy beam; an illumination optical system which irradiates the energy beam from the light source onto the mask; a projection optical system which projects the energy beam outgoing from the mask onto an image plane; a first photosensor which measures an energy amount of the energy beam which passes through an inner portion of the illumination optical system; a second photosensor which measures an energy amount of the energy beam which passes through at least a portion of the projection optical system; and a control unit which adjusts an energy amount provided to the substrate during synchronous movement of the mask and the substrate based on a measurement value of the first photosensor in consideration of an energy amount measured with the second photosensor.

With this apparatus, the first photosensor measures the first energy amount of the energy beam that passes through an illumination optical path from the light source to the mask. And when the mask and the energy beam has a predetermined positional relationship, the second photosensor measures the second energy amount of the energy beam which has passed through at least a portion of the projection optical system. Then, the control unit adjusts the exposure amount provided on the substrate based on the measurement value of the first photosensor during synchronous movement of the mask and substrate, that is scanning exposure. This adjustment is made, in consideration of the energy amount measured by the second photosensor.

The transmittance change of the energy beam in the optical path from the first photosensor to the substrate surface (image plane), is almost precisely reflected to the value obtained by dividing the measurement value of the second photosensor by the measurement value of the first photosensor and normalizing the result. According to the present invention, therefore, when the control unit adjusts the exposure amount provided to the substrate during scanning exposure based on the measurement value of the first photosensor this adjustment is performed considering the measurement value of the second sensor. As a consequence, the influence of the transmittance change of the energy beam can be suppressed, allowing exposure amount control with high precision, which in turn allows exposure with high precision.

Also, with the second exposure apparatus according to the present invention, the energy amount of the energy beam can be measured by the first and second photosensors at all times, even when the pattern is being transferred onto the substrate. This allows the change in transmittance of the energy beam in the optical path to be precisely monitored to some extent. Therefore, a more precise exposure amount control becomes possible, compared with the case when the exposure amount control is performed based on prediction of the transmittance change of the optical system during exposure. In addition, the frequency of the transmittance measurement of the optical path during exposure can be reduced, as a result, improving the throughput of the total exposure process. Accordingly, the influence of transmittance change in the optical system can be suppressed, allowing exposure with high precision and high throughput.

With the second exposure apparatus according to the present invention, the exposure apparatus can further comprise: a detection unit which detects a positional relationship between the mask and the energy beam when the energy amount is detected by the second photosensor; a storage unit which stores a measurement value of the second photosensor used to adjust the energy amount; wherein the control unit can set a positional relationship of the mask and the energy beam to the positional relationship detected by the detection unit in accordance with a detection result of the detection unit, can read a measurement value measured by the second photosensor, and can update the measurement value of the second photosensor stored in the storage unit. In such a case, the detection unit can detect the positional relationship between the mask and the energy beam when the second photosensor measures the energy amount of the energy beam emitted from the light source that irradiates the mask via the illumination optical system, emerges from the mask and is incident on the projection optical system. And based on the detection results of the detection unit, the control unit measures the energy amount using the second photosensor to update the measurement values stored in the storage unit. The same area on the mask is irradiated in this measurement, as of the previous measurement when the data stored was measured. Accordingly, even if the transmittance or reflectance of the mask differs depending on position, a highly precise update of the measurement value of the second photosensor can be performed without being affected by the difference. In this case, the updated measurement value of the second photosensor precisely reflects the change in transmittance of the optical system.

In this case, the control unit may update the measurement value of the second photosensor when the mask and the substrate are moving. In such a case, when the mask and substrate is moving, for example, during synchronous movement or before or after the synchronous movement, the measurement value of the second photosensor can be updated. Therefore, the update of the measurement value of the second photosensor can be performed without reducing the throughput.

Also, in this case, the control unit may naturally update the measurement value of the second photosensor in accordance only with the measurement value of the second photosensor obtained in the latest exposure. However, the control unit may update the measurement value of the second photosensor by using a weighted average value of the measurement value of the second photosensor, the weighted average value being obtained from a plurality of exposures performed most recently.

In the second exposure apparatus according to the present invention, the exposure apparatus may further comprise: a detection unit which detects a positional relationship between the mask and the energy beam when the energy amount is detected by the second photosensor; and a storage unit which stores a measurement value of the second photosensor used to adjust the energy amount; wherein the control unit sets a positional relationship between the mask and the energy beam which differs from a positional relationship previously detected by the detection unit, reads a measurement value measured by the second photosensor, and updates the measurement value of the second photosensor stored in the storage unit in accordance with the measurement value read by the control unit and a correlation value of an incident/outgoing energy amount of the mask which corresponds to a positional relationship between the mask and the energy beam when the measurement value is read. In such a case, when the measurement value of the second photosensor is updated, the correlation value of the incident/outgoing energy amount of the mask corresponding to the area on the mask where the energy beam is irradiated is used. As a consequence, a highly precise update of the measurement value of the second photosensor can be performed without being affected by the difference in the transmittance of the mask depending on position.

In this case, the control unit may update the measurement value of the second photosensor when the mask and the substrate are moving. In such a case, when the mask and substrate is moving, for example, during synchronous movement or before or after the synchronous movement, the measurement value of the second photosensor can be updated. Therefore, the update of the measurement value of the second photosensor can be performed without reducing the throughput.

Also, in this case, the control unit may naturally update the measurement value of the second photosensor in accordance only with the measurement value of the second photosensor obtained in the latest exposure. However, the control unit may update the measurement value of the second photosensor by using a weighted average value of the measurement value of the second photosensor, the weighted average value being obtained from a plurality of exposures performed most recently.

With the second exposure apparatus according to this invention, the control unit may correct a conversion coefficient to assume an illuminance on a image plane, based on a measurement value of the first photosensor in consideration of a measurement value of the second photosensor when the energy provided on the substrate is adjusted.

With the second exposure apparatus according to this invention, the exposure apparatus can further comprise: a third photosensor which measures an energy amount of the energy beam irradiated on an image plane of the projection optical system at a time other than exposure; a calibration unit which repeatedly measures an energy amount of the energy beam by the first, second, and third photosensors simultaneously and calibrates a relationship of measured values among the photosensors at a predetermined timing. In such a case, the calibration unit can calibrate the relationship of the measured values among the respective photosensors at a predetermined timing. Therefore, the assumption error of the illuminance (energy amount) of the image plane that is assumed from the measurement value of the first photosensor, can be corrected. This assumption error occurs over a long period of time, and cannot be corrected with the relationship of the measured values of the energy amount between the first and second photosensors. Consequently, a more highly precise exposure amount control becomes possible.

With the second exposure apparatus according to this invention, a low absorptive gas may be purged in an optical path of the energy beam, the optical path from the light source to a surface of the substrate. In such a case, the absorption of the energy beam in the optical path can be suppressed, therefore, reduction in the transmittance of the energy beam in the illuminated optical path can be suppressed.

With the second exposure apparatus according to this invention, the energy beam may a beam in a vacuum ultraviolet region having a wavelength not exceeding 200 nm. Light in such a wavelength region can cope with the requirement for higher resolution due to finer semiconductor integrated circuits. Furthermore, since such light is greatly absorbed by absorptive gas such as oxygen, the effect to suppress absorption when a low absorptive gas is purged in the optical path is extremely large. Also, it is not easy to keep the gas even temporally. With the present invention, however, the value reflecting the change in transmittance during exposure can be monitored almost precisely, and a highly accurate exposure amount control is possible even is the evenness is not so tightly controlled, thus does not cause a serious problem.

According to the fifth aspect of the present invention, there is provided a third exposure apparatus which irradiates an energy beam on a mask and transfers a pattern formed on the mask onto a substrate, the exposure apparatus comprising: at least one photosensor which has a cover glass made of fluorine doped quartz where the energy beam passes through and a photodetection element which receives the energy beam having passed through the cover glass.

With this exposure apparatus, since the photosensor has a cover glass made of amorphous material having high transmittance to the energy beam and a photodetection element which receiving surface is covered with the cover glass, dust or small particles can be shielded and the (receiving surface of) the photodetection element can be protected. The cover glass made of fluorine doped quartz, as is likewise with a cover glass made of synthetic silica glass, can be affixed to a frame holding the photosensor made of material such as metal or ceramics by a thermal means.

According to the sixth aspect of the present invention, there is provided a fourth exposure apparatus which irradiates ultraviolet light on a mask and transfers a pattern formed on the mask onto a substrate, the exposure apparatus comprising: a mask stage which mounts the mask; and a control unit which irradiates the ultraviolet light onto the mask to remove at least one of vapor or organic contaminants adhered on the mask, before the mask is mounted on the stage and the pattern is transferred onto the substrate.

With this apparatus, prior to transferring the mask pattern onto the substrate, the control unit irradiates ultraviolet light, which is the illumination light for exposure onto the mask. This removes at least one of vapor or organic contaminants adhered on the mask, making it possible to suppress the mask from changing in transmittance or reflectance during exposure.

According to the seventh aspect of the present invention, there is provided a first method of making an exposure apparatus which transfers a pattern formed on a mask onto a substrate, the method comprising: providing an illumination optical system which irradiates an energy beam on the mask; providing a projection optical system which projects an outgoing energy beam from the mask onto the substrate; providing a first photosensor which detects an energy amount of the energy beam which passes through an inner portion of the illumination optical system; providing a second photosensor which detects an energy amount of the energy beam which has passed through at least a portion of the projection optical system; and providing an exposure amount control unit which controls an exposure amount provided to the substrate during exposure in accordance with detection results of the first and second photosensors.

According to the eighth aspect of the present invention, there is provided a second method of making an exposure apparatus which energy beam irradiates a mask having a pattern formed and transfers the pattern onto a substrate while synchronously moving the mask and the substrate, the method comprising: providing a light source which emits the energy beam; providing an illumination optical system which irradiates the energy beam from the light source onto the mask; providing a projection optical system which projects the energy beam outgoing from the mask onto an image plane; providing a first photosensor which measures an energy amount of the energy beam which passes through an inner portion of the illumination optical system; providing a second photosensor which measures an energy amount of the energy beam which passes through at least a portion of the projection optical system; and providing a control unit which adjusts an energy amount provided to the substrate during synchronous movement of the mask and the substrate based on a measurement value of the first photosensor in consideration of an energy amount measured with the second photosensor.

With the second method of making the exposure apparatus, the method may further comprise: providing a third photosensor which measures an energy amount of the energy beam irradiated on an image plane of the projection optical system at a time other than exposure; providing a calibration unit which repeatedly measures an energy amount of the energy beam by the first, second, and third photosensors simultaneously and a relationship of measured values among the photosensors at a predetermined timing.

Also, in the lithographic process, by using the exposure method in the present invention for exposure, a pattern can be accurately formed on a substrate, therefore, microdevices with high integration can be produced with high yield, thus improving the productivity. Similarly, in the lithographic process, by using the exposure apparatus in the present invention for exposure, the exposure amount control accuracy is improved, resulting in improving the preciseness of line width control, allowing a pattern to be accurately formed on a substrate. Accordingly, microdevices with high integration can be produced with high yield, thus improving the productivity. Therefore, from another aspect of the present invention, there is provided a device manufacturing method that uses the exposure apparatus of the present invention, and a device manufactured by the device manufacturing method.

DESCRIPTION OF THE PREFERRED EMBODIMENTS

<<First Embodiment>>

The first embodiment of the present invention will be described below with reference to FIGS. 1 to 4.

Figure 1:
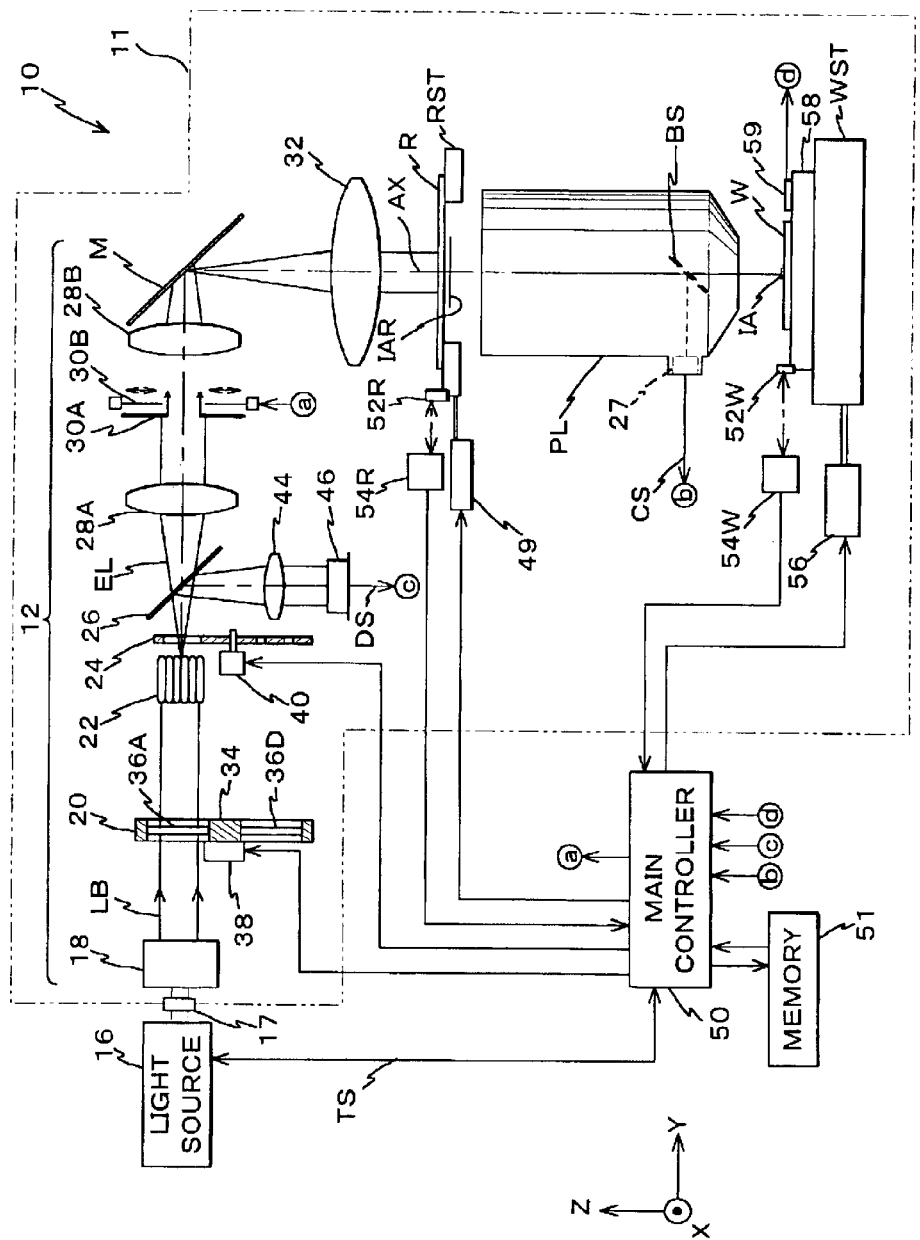
FIG. 1 is a view schematically showing the arrangement of an exposure apparatus according to the first embodiment of the present invention.

FIG. 1 shows the schematic arrangement of an exposure apparatus 10 according to the first embodiment. This exposure apparatus 10 is a scanning exposure apparatus, in short, a scanning stepper, based on a step-and-scan method which uses a pulse laser light source as an exposure light source (hereinafter referred to as "light source").

The exposure apparatus 10 includes: an illumination system structured of a light source 16 and an illumination optical system 12; a reticle stage RST to hold a reticle R as a mask illuminated with exposure light EL as an energy beam from the illumination system; a projection optical system PL to project the exposure light EL emerging from the reticle R onto a wafer W (on an image plane) as a substrate; a wafer stage WST as a substrate stage on which a Z tilt stage 58 holding the wafer W is mounted; a control system for these components, and the like.

As the light source 16, in this embodiment, a pulse ultraviolet light source emitting pulse light in the vacuum ultraviolet light region such as an ArF excimer laser light source (output wavelength: 193 nm) or a $F_2$ laser light source (output wavelength: 157 nm) is used. Alternatively, as the light source 16, a light source emitting pulse light in the ultraviolet region such as a KrF excimer laser light source (output wavelength: 248 nm) can be used.

The light source 16 is, in actual, arranged in a service room with low degree of cleanliness, separate from a clean room. In the clean room, a chamber 11 is set up which houses the structuring elements of the illumination optical system 12, reticle stage RST, projection optical system PL, and the wafer stage WST which configure the main portion of the exposure apparatus. The light source 16 is connected to the chamber 11 via a light guiding optical system not shown in Figs., which includes at least an optical axis adjustment optical system called a beam matching unit.

Figure 2:
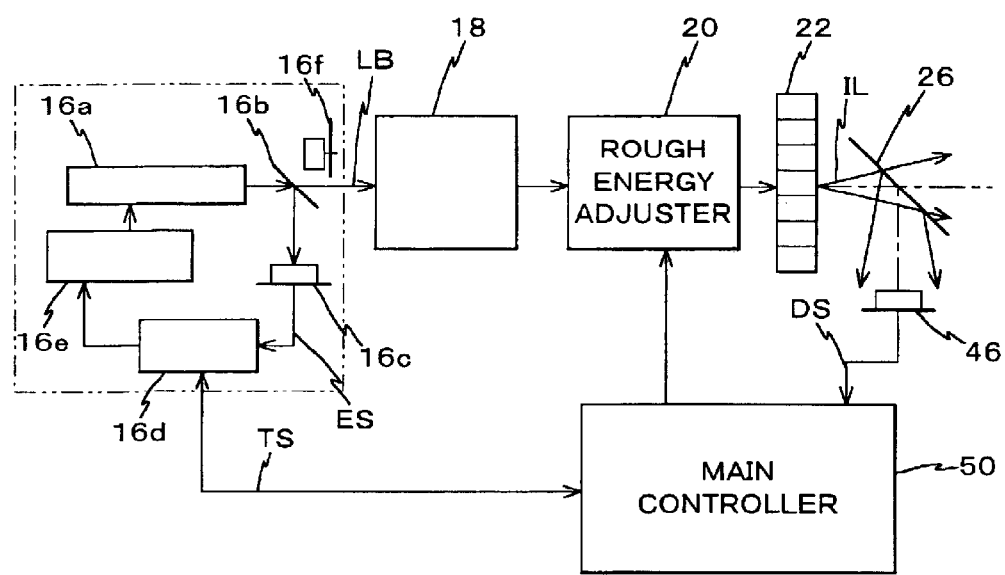
FIG. 2 is a block diagram showing the internal structure of the light source in FIG. 1 with the main controller.

FIG. 2 shows the internal arrangement of the light source 16, along with the main controller 50. The light source 16 has a laser resonator 16a, a beam splitter 16b, an energy monitor 16c, an energy controller 16d, a high-voltage power supply 16e, and the like.

A laser beam LB emitted in the form of pulse light from the laser resonator 16a is incident on the beam splitter 16b, which has a high transmittance and a sufficiently low reflectivity. The laser beam LB passing through the beam splitter 16b is emitted externally, and the laser beam LB reflected by the beam splitter 16b, is incident on the energy monitor 16c which is structured of a photoelectric conversion device. And a photoelectric conversion signal from the energy monitor 16c is supplied to the energy controller 16d as an output ES via a peak hold circuit (not shown in Figs.).

In a normal emission state, the energy controller 16d feedback-controls the power supply voltage of the high-voltage power supply 16e so that the output ES from the energy monitor 16c corresponds to a target value of energy per pulse within the control information TS supplied from the main controller 50. In addition, the energy controller 16d controls the energy supplied to the laser resonator 16a through the high-voltage power supply 16e, thereby also changing the oscillation frequency. That is, the energy controller 16d determines the oscillation frequency of the light source 16 to a frequency instructed by the main controller 50 in accordance with the control information TS from the main controller 50. The energy controller 16d also feedback-controls the power supply voltage of the high-voltage power supply 16e so that the energy per pulse in the excimer laser light source 16 becomes a value instructed by the main controller 50. The details of this technique are disclosed in, for example, U.S. Pat. No. 5,728,495, which is fully incorporated herein by reference.

Also, outside the beam splitter 16b in the excimer laser light source 16, a shutter 16f is arranged which shields the laser beam LB in accordance with control information from the main controller 50.

Referring back to FIG. 1, the illumination optical system 12 includes: a beam shaping optical system 18; a rough energy adjuster 20; a fly-eye lens 22 as an optical integrator (a homogenizer); an illumination system aperture stop plate 24; a beam splitter 26; a first relay lens 28A; a second relay lens 28B; a fixed reticle blind 30A; a movable reticle blind 30B; an optical path deflecting mirror M; a condenser lens 32; and the like. A rod lens maybe used as an optical integrator instead of the fly-eye lens 22.

The beam shaping optical system 18 is connected to the beam matching unit (not shown Figs.) via a light transmittance window 17 arranged in the chamber 11. The beam shaping optical system 18 shapes the cross-sectional shape of the laser beam LB which is a pulse beam emitted from the light source 16, passing through the light transmittance window 17. Thus, the laser beam LB can be efficiently incident on the fly-eye lens 22 arranged downstream of the optical path of the laser beam LB. The beam shaping optical system 18 can be configured, for example, of a cylinder lens or beam expander (neither is shown in Figs.).

The rough energy adjuster 20 is arranged on the optical path, further downstream of the beam shaping optical system 18 of the laser beam LB. In this case, a plurality of (e.g., six) ND filters (FIG. 1 shows two ND filters 36A and 36D of the ND filters) having different transmittances (=1−attenuation ratio) are arranged around a rotating plate 34. The transmittance to the incident laser beam LB can be switched geometrically in steps from 100% by rotating the rotating plate 34 using a driving motor 38. The driving motor 38 is controlled by the main controller 50, which is described later in the description. The transmittance may be adjusted more finely by arranging another rotating plate identical to the rotating plate 34, combining them to make two sets of ND filters.

The fly-eye lens 22 is located on the optical path of the laser beam LB outgoing from the rough energy adjuster 20, and forms many secondary sources so as to illuminate the reticle R with light which has a uniform illuminance distribution. The laser beam emerging from each secondary light source will be referred to as "exposure light EL" hereinafter.

The illumination system aperture stop plate 24 formed of a disk-shaped member is arranged in the vicinity of the emitting surface of the fly-eye lens 22. The illumination system aperture stop plate 24 may have a plurality of aperture stops arranged at equal angular intervals: an aperture stop of an ordinary circular aperture; a small circular aperture and designed to reduce the σ value which is a coherence factor; a ring-shaped aperture stop for ring-shaped illumination; and a plurality of aperture stops of which each central position differ from the optical axis position for modified illumination (only two types of apertures are shown in FIG. 1). The main controller 50 (to be described later) rotates and controls the illumination system aperture stop plate 24 via a driving unit 40 such as a motor. With this operation, one of the aperture stops is selectively chosen and arranged on the optical path of the exposure light EL.

The beam splitter 26 which has a low reflectivity and a high transmittance is arranged on the optical path of the exposure light EL emerging from the illumination system aperture stop plate 24. In addition, a relay optical system is arranged on the optical path further downstream of the beam splitter 26. The relay optical system is structured of the first and second relay lenses 28A and 28B with the fixed reticle blind 30A and the movable reticle blind 30B arranged in between.

The fixed reticle blind 30A is arranged on a plane that is slightly defocused from a plane conjugate to the pattern surface of the reticle R, and has a rectangular opening for determining an illumination area IAR on the reticle R. In the vicinity of the fixed reticle blind 30A, the movable reticle blind 30B is arranged, which has an opening portion that is variable in position and width in the scanning direction. At the beginning and end of scanning exposure, the movable reticle blind 30B further restricts the illumination area IAR to prevent exposure on an unnecessary portion.

The deflecting mirror M for reflecting the exposure light EL transmitted through the second relay lens 28B toward the reticle R is arranged on the optical path of the exposure light EL downstream of the second relay lens 28B of the relay optical system. The condenser lens 32 is arranged on the optical path of the exposure light EL, further downstream of the deflecting mirror M.

The function of the illumination system 12 having this arrangement will be briefly described below. The laser beam LB emitted from the light source 16 by pulse emission is incident on the beam shaping optical system 18, in which the cross-sectional shape of the laser beam LB is shaped so that the laser beam can be efficiently incident on the fly-eye lens 22. The laser beam LB is then incident on the rough energy adjuster 20, transmitted through one of the DN filters of the rough energy adjuster 20, and incident on the fly-eye lens 22. With this operation, multiple secondary light sources are formed at the exit end of the fly-eye lens 22. The exposure light EL emerging from these multiple secondary light sources passes through one of the aperture stops on the illumination system aperture stop plate 24 and reaches the beam splitter 26 having a high transmittance and a low reflectivity. The exposure light EL transmitted through the beam splitter 26 passes through the first relay lens 28A and then proceeds to the rectangular opening portion of the fixed reticle blind 30A and the movable reticle blind 30B. It then goes onto the second relay lens 28B, and its optical path is vertically bent downward by the deflecting mirror M. After it is deflected, the exposure light EL passes through the condenser lens 32 and illuminates the rectangular illumination area IAR on the reticle R with a uniform illuminance distribution, the reticle R held on the reticle stage RST.

Meanwhile, the exposure light EL that is reflected by the beam splitter 26 proceeds to the integrator sensor 46 serving as a first sensor via a condenser lens 44. A photoelectric conversion signal from the integrator sensor 46 is supplied as an output DS (digit/pulse) to the main controller 50 through a peak hold circuit and A/D converter (neither is shown in Figs.).

Figure 3:
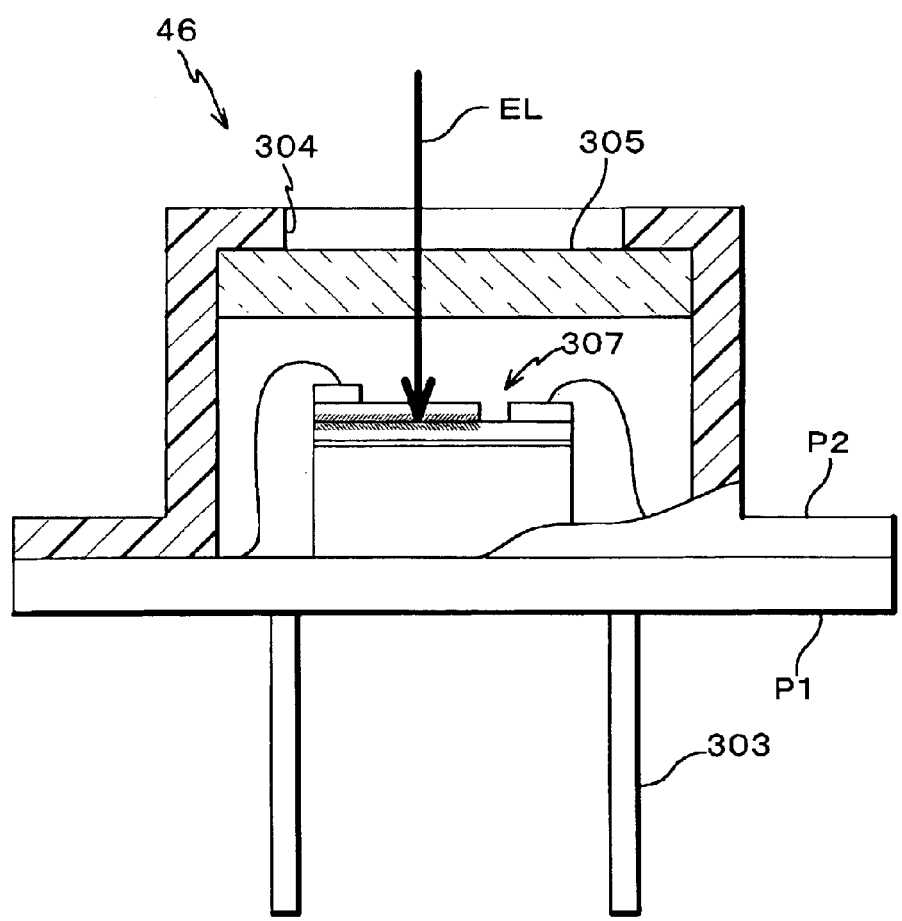
FIG. 3 is a view exemplifying the structure of the integrator sensor in FIG. 1.

With the integrator sensor 46, as shown in FIG. 3 for example, a hermetic seal container is used, and is structured with a photodetection element 307 mounted on a stem P1 which has a terminal 303, and a cap P2 which seals the photodetection element 307. The cap P2, has a window 304 arranged, so as to guide the external beam internally to be incident on the photodetection element 307, similar to the package for photodetection element known in the art. On the inner side of the window 304, a cover glass 305 is fixed so as to shield the dust or small particles while letting the exposure light pass.

As the photodetection element 307, photodiodes such as a silicon photodiode or a photodiode made of aluminum gallium nitride is used. Also, as the material of the cover glass 305, synthetic silica glass, fluorite, or magnesium fluoride can be used. In the case of using an exposure light that has a wavelength not exceeding 170 nm, however, it is difficult to use ordinary synthetic silica glass from the viewpoint of transmittance. And, in the case of using fluorite or magnesium fluoride as the material of the cover glass 305, it makes it difficult to affix the material to the stem P1 (frame), which holds the photodetection element 307 and is made from material such as metal or ceramics.

Accordingly, in the case the $F_2$ laser beam (wavelength: 157 nm) is used as the exposure light, as the material of the cover glass 305, a so-called fluorine doped quartz that has the hydroxyl group removed from its composition and fluorine added, is to be used. The fluorine doped quartz is of amorphous materials that has high transmittance to the $F_2$ laser beam, and has the advantage of being similar to the conventional synthetic silica glass, that is, it can be affixed to the stem P1 by a thermal method.

By using the integrator sensor 46 shown in FIG. 3, the exposure light EL, being the $F_2$ laser beam having a wavelength of 157 nm or the ArF excimer laser beam and the like, passes through the cover glass 305 and is detected with high sensitivity by the semiconductor photodetection element 307.

With the exposure apparatus 10, since the exposure wavelength does not exceed 200 nm, an optical detection unit made of diamond thin film that is durable and has sensitivity to light which does not exceed 200 nm can be used as the integrator sensor 46. It is likewise, in the case of the irradiation amount monitor 59 (refer to FIG. 1) which will be described later.

The fluorine doped quartz mentioned above, can also be used as the cover glass material for other sensors. For example, with these types of exposure apparatus, an imaging sensor is used in the reticle alignment microscope, which is used for alignment of the reticle R in particular. On the light receiving surface of the imaging sensor (a CCD imager is used in general), which utilizes the exposure wavelength, a cover glass is required likewise, as above.

And, as for the exposure apparatus using vacuum ultraviolet light such as the $F_2$ laser beam, it is preferable to use the fluorine doped quartz also for the cover glass of the CCD imager for the same reasons described above.

As a matter of course, it is possible to use the fluorine doped quartz as the glass cover material of other optical sensors (for example, the energy monitor 16c (refer to FIG. 2)).

With the exposure apparatus 10 in this embodiment that uses vacuum ultraviolet light, when the cover glass 305 is a fixed facing the photodetection element 307, the gas in between the cover glass 305 and the photodetection element 307 which absorbs the vacuum ultraviolet is to be exhausted. And alternatively, needless to say, the space needs to be filled with an inert gas (a low absorptive gas).

Referring back to FIG. 1, the reticle R is mounted on the reticle stage RST, and is fixed to the stage via static suction (or vacuum chucking) and the like (not shown in Figs.) The reticle stage RST can be finely driven within the horizontal surface (XY plane), and is scanned in the scanning direction (the landscape direction in FIG. 1 being the Y direction, in this case) by the reticle stage driving portion 49 within a range of predetermined strokes. The position of the reticle stage RST during scanning is measured by an external laser interferometer 54R via a movable mirror 52R fixed on the reticle stage RST, and the measured value of the laser interferometer 54R is supplied to the main controller 50.

The material used for the reticle R is to differ depending on the light source (exposure wavelength) used. For example, when the light source used is a KrF excimer laser or an ArF excimer laser, the material of the reticle R can be synthetic silica glass. In the case of the light source being a $F_2$ laser, however, the material needs to be fluorite, or fluorine doped quartz.

As the projection optical system PL, for example, a refraction system which is double telecentric and is structured of a plurality of lens elements that have a common optical axis AX in the Z-axis direction is employed. The projection magnification of the projection optical system PL is, for example, ¼, ⅕, or ⅙. Therefore, when the illumination area IAR on the reticle R is illuminated with the exposure light EL as described above, an image of a pattern formed on the reticle R which is reduced by the projection optical system PL at the projection magnification is projected and transferred onto a slit-shaped exposure area IA on the wafer W coated with a resist (photosensitive agent).

Since vacuum ultraviolet light (VUV light) having a wavelength of about 200 nm or less is used in this embodiment, as the projection optical system PL, a reflection/refraction system (catadioptric system) including reflection optical elements and refraction optical elements can be used. In this case, as a reflection/refraction type projection optical system, the following system can be used: a reflection/refraction system having a beam splitter and concave mirror as reflection optical elements, which is disclosed in, for example, Japan Patent Laid Open No. 08-171054, U.S. Pat. No. 5,668,672 corresponding thereto, Japan Patent Laid Open No. 10-20195, and U.S. Pat. No. 5,835,275 corresponding thereto, or a reflection/refraction system having a concave mirror and the like as reflection optical elements without using any beam splitter, which his disclosed in, for example, Japan Patent Laid Open No. 8-334695, U.S. Pat. No. 5,689,377 corresponding thereto, Japan Patent Laid Open No. 10-3039, and U.S. patent application Ser. No. 873,605 (application date: Jun. 12, 1997) corresponding thereto. The above disclosures are fully incorporated herein by reference.

In addition, the reflection/refraction system disclosed in U.S. Pat. Nos. 5,031,976, 5,488,229, and 5,717,518 may be used. In the disclosure, a plurality of refraction optical elements and two mirrors (a main mirror which is a concave mirror, and a sub-mirror which is a rear mirror having a reflecting surface formed on a surface of a refraction element or plane-parallel plate which is located on the opposite side of the incident surface) are arranged coaxially, and an intermediate image of a reticle pattern formed by the plurality of refraction optical elements re-formed on a wafer by the main mirror and sub-mirror. In this reflection/refraction system, the main mirror and sub-mirror are arranged following the plurality of refraction optical elements, and illumination light passes through a portion of the main mirror to be sequentially reflected by the sub-mirror and main mirror, and reaches the wafer through a portion of the sub-mirror. The above disclosures are fully incorporated herein by reference.

Also, as a reflection/refraction type projection optical system a reduction system can be used which projection magnification is ¼ or ⅕, has a circular image field, and is double telecentric on both the object plane side and image plane side. In the case of a scanning exposure apparatus comprising this reflection/refraction type projection optical system, the irradiation area of the illumination light can be in the field of the projection optical system with the optical axis of the projection optical system roughly in the center, and be a rectangular shape extending in the direction almost perpendicular to the scanning direction of the reticle or the wafer. With the scanning exposure apparatus comprising such a reflection/refraction type projection optical system, even in the case of using an $F_2$ laser beam having a wavelength of 157 nm as the illumination light for exposure, for example, a fine pattern of around a 100 nm L/S pattern can be transferred with high precision on to the wafer.

In the case the exposure light EL is an ArF excimer laser or a KrF excimer laser, the respective lens elements structuring the projection optical system can be made of synthetic silica glass. In the case of the exposure light being a $F_2$ laser, however, the material of the lens elements used in the projection optical system all need to be fluorite. When the exposure light EL is the ArF excimer laser beam the projection optical system can be a refraction system consisting of only refraction optical elements, and when the exposure light EL is the $F_2$ laser beam the projection optical system can be of the all reflection type.

Around the lower end inside the barrel of the projection optical system PL at a position not conjugate to the image plane, a beam splitter BL having a transmittance around 97 to 99% is arranged. On the optical path of the reflection beam of the beam splitter BS, a sub-integrator sensor 27 serving as a second optical sensor is arranged. Various types of sensors can be used as the sub-integrator sensor 27, however, in this case, an identical photodetection element as the integrator sensor 46 is used. Likewise, this sensor receives and photoelectrically converts the exposure light EL into a photoelectric conversion signal CS (electric signal corresponding to the second energy amount detected), and supplies it to the main controller 50 via the peak hold circuit and A/D converter (not shown in Figs.).

In this case, as is obvious from FIG. 1, similar to the integrator sensor 46, the sub-integrator 27 can detect the energy amount of the exposure light EL (almost equal to the energy amount of the exposure light EL at the image plane) passing through most of the projection optical system and proceeding to the wafer W at all times, even when a pattern is being transferred onto the wafer W.

The wafer stage WST is driven two dimensionally by the wafer stage driving portion 56, in the Y direction which is the scanning direction and the X direction which is perpendicular to the Y direction. Mounted on the wafer stage WST is the Z tilt stage 58, and on the Z tilt stage 58 the wafer W is held via a wafer holder (not shown in Figs.) by static suction (or vacuum chucking). The Z tilt stage 58 adjusts the position of the wafer W in the Z direction (focus position) as well as adjusts the tilting angle of the wafer W with respect to the XY plane. Also, the position of the wafer stage WST is measured by the external laser interferometer 54W via the movable mirror 52W fixed on the Z tilt stage 58, and the measured value of the interferometer 54W is sent to the main controller 50.

In addition, on the Z tilt stage 58 (or the wafer stage WST), an irradiation amount monitor 59 is arranged as a third optical sensor to detect the light amount of the exposure light EL passing through the projection optical system and irradiating the wafer surface (image plane) (the third energy amount). The irradiation amount monitor 59, has an arrangement similar to the integrator sensor 46 described earlier. In this case, the light receiving surface of the photodetection element below the cover glass which structure the irradiation amount monitor 59, is set at almost the same height as of the surface of the wafer W. The photoelectric conversion signal of the irradiation amount monitor 59 is sent to the main controller 50, as is likewise with the photoelectric conversion signal DS of the integrator sensor 46 and the photoelectric conversion signal CS of the sub-integrator sensor 27.

The main controller 50 serving as the controller, as is shown in FIG. 1, mainly structures the control system. The main controller 50 includes microcomputers (or workstations) that carries a CPU (chief processing unit), a ROM (read only memory), a RAM (random access memory), and the like. And, operations such as the synchronous scanning of the reticle R and the wafer W, the stepping of the wafer W, the exposure timing are totally controlled by the main controller 50 so that exposure is accurately performed. In addition to these controls, the main controller 50 also controls the exposure amount to the wafer W during scanning exposure, as will be described later on.

More particularly, for example, the main controller 50 controls the position and velocity of the reticle stage RST and the wafer stage WST via the reticle stage driving portion 49 and the wafer stage driving portion 56 during scanning exposure. This control is based on the measurement values of the laser interferometer 54R and 54W, and based on these values, the reticle R is scanned in the +Y direction (or the −Y direction) at a velocity $V_R=V$ via the reticle stage RST. The wafer W, on the other hand, is synchronously scanned in the −Y direction (or the +Y direction) with respect to the exposure area IA at a velocity $V_W=\beta \cdot V$ ($\beta$ is the projection magnification from the reticle R to the wafer W) via the wafer stage RST. Also, when stepping operation is performed, the main controller 50 controls the position of the wafer stage WST via the wafer stage driving portion 56 in accordance with the measured value of the laser interferometer 54W.

Furthermore, during scanning exposure, in order to provide the preset exposure amount (target exposure amount) to the wafer W determined in accordance with exposure conditions and resist sensitivity, the light amount of the exposure light EL irradiated on the reticle R, that is, the exposure amount is adjusted. For this adjustment, the main controller 50 sends control information TS to the light source 16, to control the oscillation frequency (emission timing) of the light source 16 and the power of emission, or, controls the rough energy adjuster 20 via the motor 38. The exposure amount control of the wafer W will be described later on. The main controller 50, also controls the illumination system aperture stop plate 24 via the driving unit 40, and in addition controls the opening and closing of the movable reticle blind 30 in synchronous with the operation information of the stage system.

As has been described, the main controller 50 plays both the role of an exposure controller (exposure amount control unit) and a stage controller (stage control unit). It is a matter of course that these controllers may be arranged individually, separate from the main controller 50.

The exposure operations of the exposure apparatus 10 having the arrangement above, will be described briefly next, with reference to FIG. 1.

First of all, under the control of the main controller 50, the reticle loader and the wafer loader (not shown in Figs.) respectively perform reticle loading and wafer loading. Also, preparatory operations, such as reticle alignment and baseline measurement (measurement of the distance between the detection center of the alignment detection system and the optical axis of the projection optical system) are performed by predetermined procedures. A reticle microscope, a reference mark plate on the wafer stage WST, an off-axis alignment detection system (not shown in Figs.), and the like are used in the preparatory operations.

The main controller 50, then performs alignment measurement such as EGA (enhanced global alignment) using the alignment detection system (not shown in Figs.) on the wafer W. Regarding the EGA, the details are disclosed in, for example, Japan Patent Laid Open No. 61-44429 and the corresponding U.S. Pat. No. 4,780,617, which are fully incorporated herein by reference.

When the wafer W needs to be moved during such operations, the main controller 50 moves the wafer stage WST (wafer W) in a predetermined direction. After such alignment measurement is completed, exposure based on the step-and-scan method is performed as follows.

On exposure, first of all, the wafer stage WST is moved so that the XY position of the wafer W is positioned at the starting position of scanning to expose the first shot area (first shot) on the wafer W. And, at the same time, the reticle stage RST is moved so that the XY position of the reticle R is brought to the starting position of scanning. Then, the main controller 50 synchronously moves the reticle R (reticle stage RST) and the wafer W (wafer stage WST) in accordance with the positional information of the wafer W from the wafer interferometer 54W and the positional information of the reticle R from the reticle interferometer 54R. And scanning exposure is performed.

Then, when the reticle pattern is transferred onto one shot area, the wafer stage WST is stepped by one shot area, and scanning exposure on the next shot area is performed. The stepping operation and scanning exposure is repeated successively, and the pattern is transferred step by step onto the required shot areas on the wafer W. And by repeatedly performing exposure based on the step-and-scan method each time the wafer is exchanged, consequently, many slices of wafers are exposed.

While exposure is being performed in the manner above, the main controller 50 controls the light amount of the exposure light EL on each point on the wafer W, that is the exposure amount, as will be describe later on.

Referring back to the exposure apparatus 10 that uses a light source which emits light from the ultraviolet to vacuum ultraviolet region, the respective elements structuring the illumination optical system 12 are housed in an illumination housing (not shown in Figs.) so as to isolate the interior from air. On the optical path of the exposure light EL (the light flux passage) that is inside the illumination housing and also includes the interior of the projection optical system PL, low absorptive gas having low absorption to the exposure light EL is purged. The gas purged may be rare gas such as helium, argon, and krypton or inert gas such as nitrogen. The optical path may be filled with the low absorptive gas, or a flow of gas may be created. And the impurity level of the gas needs to be strictly controlled. The construction materials of the illumination optical system 12 and projection optical system PL, however, leach contaminants such as organic gas and vapor by a small amount and contaminate the surface of the lenses and mirrors, which in turn causes loss of transmittance. Whereas, when exposure light from the ultraviolet to vacuum ultraviolet region is irradiated on the optical system contaminated, the contaminants are removed by photochemical reaction thus increasing the transmittance of the optical system. Accordingly, depending on the frequency of the exposure light being irradiated (exposure) the transmittance of the illumination optical system and projection optical system changes. The cover glass surface of the respective photosensors are also similarly contaminated, however, by irradiating VUV light, the contaminants are resolved. Therefore, the output signal also changes in the state where the contaminants are on the cover glass surface, and in the state where the contaminants are removed.

Accordingly, the exposure amount control is preferably performed without being affected by the transmittance change of the optical system caused during exposure and by the transmittance change of the cover glass of the respective photosensors. In order to achieve such control, the exposure amount irradiated on the wafer surface needs to be estimated at all times. It is also possible, to make the light flux passage a vacuum environment.

The method of controlling the exposure amount used by the main controller 50 is described next.

As a premise, the output DS of the integrator sensor 46 is to be calibrated to the reference illuminometer mounted on the image plane in advance. The output CS of the sub-integrator sensor 27 and the output of the irradiation amount monitor 59 are also to be calibrated, with respect to the output DS of the integrator sensor 46 which has completed calibration. Accordingly, the conversion coefficient ($\alpha$ value) to calculate the light amount (energy amount) on the image plane based on the output of the integrator sensor 46 is to be calculated in advance and stored in the memory 51. The output of the energy monitor 16c in the light source 16 is also to be calibrated to the output DS of the integrator sensor 46. For the sake of convenience, the distribution of the reticle pattern on the pattern area of the reticle R is to be almost uniform, so that the transmittance of the reticle is not concentrated on a particular area. This supposition does not cause any problems, when the reticle is for producing memory devices in general.

Just before starting scanning exposure on the first shot area on the first wafer W, the main controller 50 irradiates the exposure light EL on the reticle R and detects the output DS of the integrator sensor 46 and the output CS of the sub-integrator sensor 27. The detection results are respectively stored in the memory 51, and the ratio of the output DS of the integrator sensor 46 to the output CS of the sub-integrator sensor 27 $\gamma_0$ is calculated by the following equation (1) and also stored in the memory 51.

$$\gamma_0 = CS_0/DS_0 \tag{1}$$

Then, scanning exposure is performed, and each time exposure on a shot area is completed, the output DS of the integrator sensor 46 and the output CS of the sub-integrator sensor 27 is sent to the main controller at a predetermined sampling interval. The value $\gamma$, which is the output CS normalized by the output DS, is calculated by the following equation.

$$\gamma = CS/DS \tag{2}$$

The ratio of the $\gamma$ to $\gamma_0$ ($\gamma/\gamma_0$), is a value that substantially reflects the change in transmittance of the exposure light EL (transmittance of the optical system) from the integrator sensor 46 to the sub-integrator 27, that is, the beam splitter 26 to the beam splitter BS. In this embodiment, the beam splitter BS is arranged near the lower end inside the barrel of the projection optical system PL. The transmittance of the optical path between the integrator sensor 46 and the sub-integrator 27, therefore, is almost equal to the transmittance of the optical path between the integrator sensor 46 and the image plane. As a consequence, by sequentially calculating the ratio $\gamma/\gamma_0$, temporal variation of the transmittance of the optical path between the integrator sensor 46 and the image plane can be monitored.

The main controller 50, therefore, monitors the temporal variation of the transmittance of the optical path between the integrator sensor 46 and the image plane during exposure, and corrects the $\alpha$ value successively by the equation (3). Also, the processing amount of the integrator sensor 46, that is, the light amount $P[mJ/(cm^2 \cdot pulse)]$ of the exposure light EL on the image plane (the average pulse energy density) can be calculated by the equation (4), by using the corrected $\alpha$ value, $\alpha'$. The light amount of the exposure light EL on the image plane can be indirectly calculated by the output of the integrator sensor 46.

$$\alpha' = \alpha \times \gamma/\gamma_0 \tag{3}$$

$$P = DS \times \alpha' \tag{4}$$

And the energy amount provided to each point on the image plane (that is the wafer W), in other words, the exposure amount irradiated onto each point on the image plane is controlled in the manner described below. This control is based on the light amount P of the exposure light EL on the image plane that can be indirectly calculated by the output of the integrator 46.

That is, with a scanning exposure apparatus that has a laser light source (pulse light source) like the exposure apparatus 10, when the scanning velocity of the wafer W (scanning velocity) is expressed as $V_W$, the width of the exposure area IA in the scanning direction (slit width) on the wafer W as D, and the pulse repetition frequency of the laser light source as F, the amount that the wafer W moves per pulse is expressed as $V_W/F$. Thus, the number of laser pulses N (the number of exposure pulses) of the exposure light IL exposing a point on the wafer W is expressed as in equation (5).

$$N=D/(V_W/F) \qquad (5)$$

Since P is the average pulse energy density, the energy amount provided per point on the wafer, that is, the exposure amount (energy amount) S is expressed as in equation (6).

$$S=N \times P=P \times D/(V_W/F) \qquad (6)$$

Accordingly, the main controller 50 controls at least either the slit width D, scanning velocity $V_W$, the pulse repetition frequency F, or the average pulse energy density P which is the light amount of the exposure light EL on the image plane indirectly calculated by the output of the integrator sensor 46, so as to make the exposure amount S expressed in the equation (6) substantially coincide with the exposure amount set in advance in accordance with conditions such as resist sensitivity. By this control, the exposure amount on the respective points on the wafer W can be made to substantially coincide with the exposure amount set in advance. Since it is difficult to adjust the slit width D during exposure due to response time, either the scanning velocity $V_W$, the pulse repetition frequency F, or the average pulse energy density P, or an arbitrary combination of these three need to be controlled.

To describe the characteristics of the embodiment, the processing amount of the integrated sensor 46 by the output DS, in other words, the calculation of the light amount of the exposure light EL on the image plane indirectly calculated by the output of the integrator sensor 46 (exposure amount: the average pulse energy density P described above) is compared to the conventional art and is exemplified next.

For example, when the output DS of the integrator sensor 46 is a [digit/pulse] as the initial condition, the conversion coefficient is to be $\alpha$ [mJ/(cm²·digit)]. And, in the case the transmittance of the optical elements in the optical path between the integrator sensor 46 and the image plane supposedly falls to a half during exposure, the exposure amount (pulse energy density) $P_1$ actually provided on the image plane is $P_1=2a \times (\frac{1}{2}) \times \alpha=a\alpha(=A)$, 2a being the output of the integrator sensor 46.

With the conventional art, however, the $\alpha$ value is constant when the exposure amount control is performed, so the exposure amount $P_2$ on the image plane is controlled in accordance with $P_2=2a \times \alpha=2a\alpha(=2A)$. Consequently, the exposure amount S' on the image plane is controlled so as to be S'=S×A/(2A)=S/2.

On the other hand, in the case of this embodiment, the ratio $\gamma/\gamma_0$ described earlier becomes $\gamma/\gamma_0=\frac{1}{2}$, and as a result, the change in transmittance to ½ is detected without fail. And by substituting the appropriate values for the equations (3) and (4):

$$\alpha'=\alpha \times \frac{1}{2}=\alpha/2 \qquad (3)'$$

$$P=2a \times \alpha/2=a\alpha=A=P_1 \qquad (4)'$$

Thus, the exposure amount on the image plane after the transmittance change can be accurately calculated as the processing amount P of the integrator sensor 46, and as a result, the exposure amount on the image plane is controlled so as to coincide with the exposure amount set in advance.

As is described, according to this embodiment, the main controller 50 monitors the output of the integrator sensor 46 and sub-integrator sensor 27 at all times. Furthermore, in accordance with the monitoring results the exposure amount P on the image plane is obtained by simple calculation, and the exposure amount P is corresponding to the transmittance change of the exposure light EL in the optical path between the integrator sensor 46 and the image plane. Since the exposure amount control is performed on the respective points on the wafer W based on the exposure amount P, this in turn substantially cancels out any effects caused by the transmittance change, and consequently a highly precise exposure amount control can be performed. The output monitoring of the integrator sensor 46 and sub-integrator sensor 27, however, does not have to be performed at all times, and may be performed periodically (in short intervals). In this case, for example, the monitoring can be performed with the sub-integrator 27 made to be inserted or withdrawn from the optical path.

In addition, with this embodiment, the light amount (energy amount) of the exposure light EL can be detected by the integrator sensor 46 and sub-integrator 27 even when the pattern of the reticle R is being transferred onto the wafer W. This allows the exposure amount to be controlled in accordance with the detection results obtained during exposure, which in turn allows a more precise exposure amount control compared with the case when the exposure amount is controlled in accordance with predictions on transmittance change of the optical system.

Furthermore, in the embodiment, the beam splitter BS is arranged near the lower end inside the barrel of the projection optical system PL, and the case has been described when the exposure light EL divided by the beam splitter BS is detected by the sub-integrator 27. The present invention, however, is not limited to this. For example, of the optical elements (such as lenses) structuring the projection optical system PL, a mirror maybe arranged in between the optical element closest to the image plane and the image plane. A second photosensor may be arranged on the optical path of the reflection beam of the mirror, and the second photosensor may detect the energy amount of the energy beam irradiated onto the optical element closest to the image plane. With this arrangement, no optical elements that may cause the transmittance to change are arranged on the optical path between the second photosensor and the image plane. Therefore, the normalized value obtained by dividing the detection result of the second photosensor by the detection result of the first photosensor described earlier becomes a value which reflects the transmittance change of the energy beam of the optical path between the first photosensor and the image plane more precisely. Thus, a more accurate exposure amount control becomes possible. In this case, however, when the mirror is arranged simply in between the image plane and the optical element closest to the image plane, the mirror may cast a shadow on the image plane that may affect the exposure accuracy. So, a preferable arrangement is to arrange the mirror off the exposure area on the wafer W, on the optical path of the exposure light EL passing through a predetermined opening made on an area outside the pattern area of the reticle R. By using this method of detecting the exposure light EL incident from the predetermined opening made on the area outside the pattern area of the reticle R, for example, even when the pattern distribution of the reticle R or the transmittance varies depending on position, the second sensor is able to detect the energy amount of the exposure light EL accurately without being affected.

Alternatively, detection units such as a photoelectric multiplier (photomultiplier) that photoelectrically converts optical energy into electric signals or a light amount detection unit made of a diamond thin film that detects catoptric light and scattered light from the lens surface may be arranged, instead of the beam splitter BS and sub-integrator 27. These detection units may detect the energy amount of the energy beam irradiated onto the lens element optically closest to the image plane. In addition, in the case the output of the detection units is low, it is also effective to perform a phase-sensitive detection with the light source pulse.

The second photosensor, however, does not necessarily have to be arranged near the lower end of the projection optical system, and may be arranged at other portions. That is, it only requires a structure so that it can detect the energy amount of the exposure light EL passing through at least a part of the inner portion of the projection optical system. Even in such a case, the transmittance change of the optical path between the first photosensor (the integrator sensor 46) and the second photosensor can be monitored in the method described in the embodiment. Therefore, the exposure amount can be controlled with higher accuracy, compared with the case when the transmittance is assumed constant and when the change in transmittance is predicted.

Figure 4:
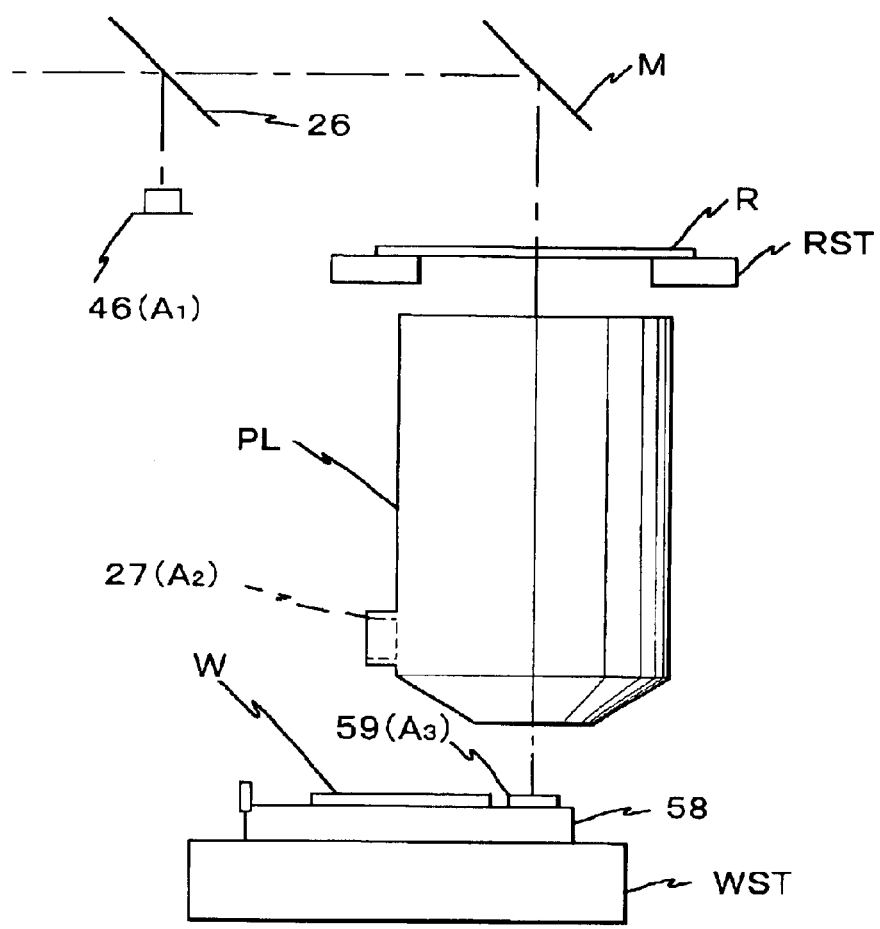
FIG. 4 is a view for describing the calibration among photosensors of the exposure apparatus in FIG. 1.

Although no reference is made earlier, correcting the α value and calculating the exposure amount on the image plane using the corrected value in accordance with the output of the integrator sensor 46 and sub-integrator sensor 27 makes the precision obviously higher than that of predicting the change in transmittance. However, this method does not directly measure the exposure amount on the image surface, therefore, in the long run, errors do occur to some extent. So, with the exposure apparatus 10, as shown in FIG. 4, measurement of the exposure light EL is performed with the integrator sensor 46, sub-integrator sensor 27, and irradiation amount monitor 59 at the same time, repeatedly at a predetermined timing. And each time the measurement is performed, in accordance with the measurement results $A_1$, $A_2$, and $A_3$, the relative relationship among the output of the respective sensors are calibrated, in addition to the calibration of the conversion coefficient used to convert the output of the integrator sensor 46 during exposure to the energy amount provided onto the image plane. Accordingly, it becomes possible to adjust the energy amount, in consideration of the temporal change in the conversion coefficient that occurs over a long period of time and cannot be corrected based on the relative relationship between the detection results of the integrator sensor 46 and sub-integrator sensor 27. Thus, a more precise control of exposure amount can be achieved. As for the predetermined timing of measurement, the timing may be when the exposure of a predetermined slices of wafers has been completed, or when the ratio $\gamma/\gamma_0$ exceeds a permissive value.

<<Second Embodiment>>

The second embodiment of the present invention will be described below with reference to FIGS. 5 to 8B. Structures and components identical or equivalent to those described in the first embodiment are designated with the same reference numerals, and the description thereabout is briefly made or is entirely omitted.

Figure 5:
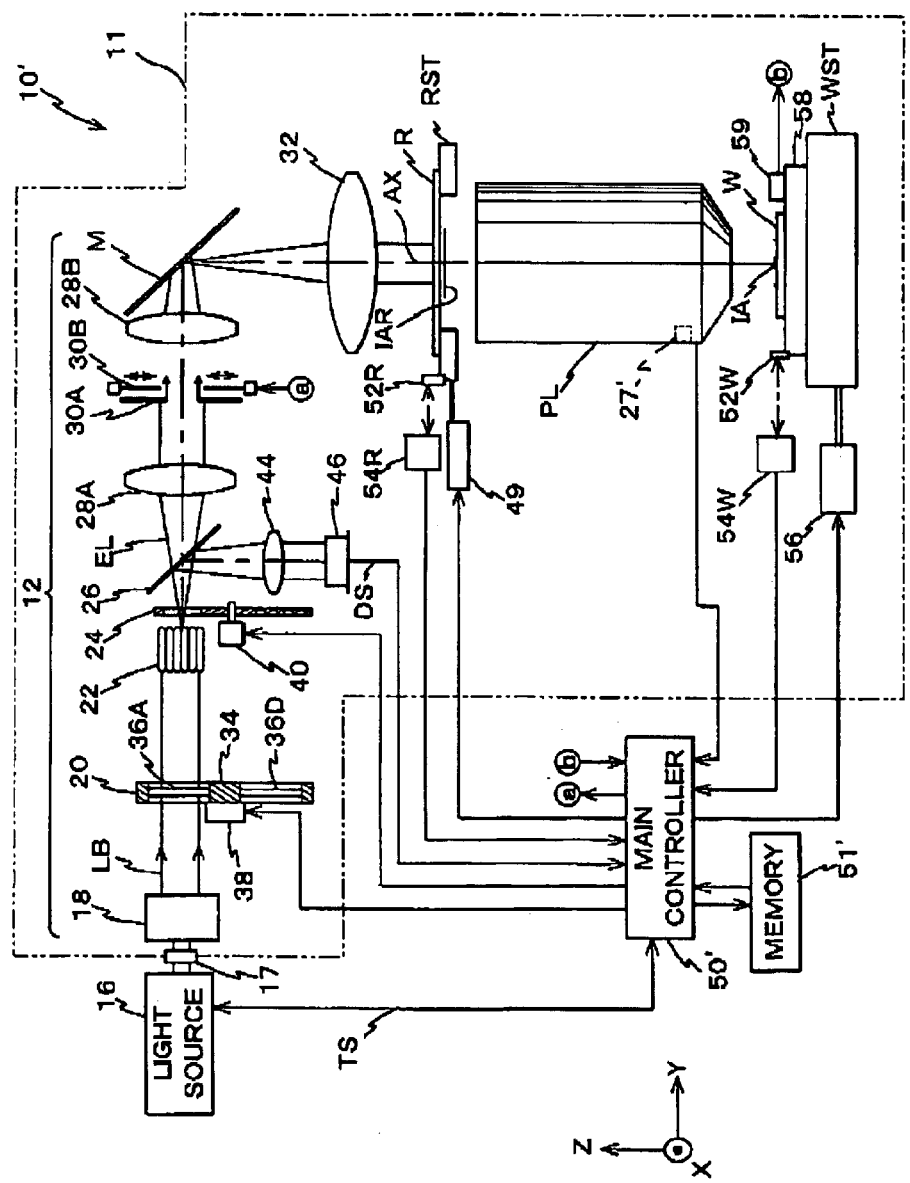
FIG. 5 is a view schematically showing the arrangement of an exposure apparatus according to the second embodiment of the present invention.

FIG. 5 shows the schematic arrangement of an exposure apparatus 10' according to the second embodiment. This exposure apparatus 10' has a similar structure as of the exposure apparatus 10 in the first embodiment in general. The exposure apparatus, however, differs on the point such as; instead of the beam splitter BS and the sub-integrator 27 a light amount monitor 27' is arranged as the second photosensor; and in the place of the main controller 50, a main controller 50' is arranged.

The exposure apparatus 10' will be described next, mainly according to such differences.

With the exposure apparatus 10', as is illustrated in FIG. 5, a light amount monitor 27' is arranged near the lower end inside the barrel of the projection optical system PL, attached to the lens element (not shown in Figs.) optically closest to the image plane (surface of the wafer W). The lens element expands/contracts by the heat generated when it absorbs the irradiation light. The light amount monitor 27' includes a piezoelectric element (piezoelectric transducer) that is a mechanical-to-electric conversion element which generates acoustic signals (electric signals converted from mechanical vibration) in accordance with the expansion or contraction of the lens element.

More particularly, the light amount monitor 27' includes a piezoelectric element made of PZT (lead zirconate titanate) and electrodes, and is affixed to the lens element optically closest to the image plane with vacuum grease. A lens holder (not shown in Figs.) made of Bakelite holds the lens element. In addition, the lens holder uses rubber (not shown in Figs.) to isolate vibration, and the rubber acoustically separates the lens element as well as reduces the acoustic generated in other parts of the apparatus.

The light amount monitor 27' outputs a signal corresponding to the absorbed light amount (proportional to the irradiation light amount) of the lens element optically closest to the image plane. As a consequence, the light amount of the exposure light EL irradiated on the lens element (the second energy amount) is directly detected. Accordingly, even when the pattern is being transferred onto the wafer W, the energy amount of the exposure light EL which passes through the projection optical system and proceeds to the wafer W (substantially matching the energy amount of the exposure light EL at the image plane) can be detected at all times. The detection signal of the light amount monitor 27' is sent to the main controller 50'.

In the second embodiment, instead of using the light amount monitor 27', the beam splitter BS and sub-integrator 27 used in the first embodiment may be used for the second photosensor. On the contrary, in the first embodiment, a photosensor similar to the light amount monitor 27' can be used as the second sensor.

Alternatively, the second sensor may have a structure, for example, of detection units such as a photoelectric multiplier (photomultiplier) that photoelectrically converts optical energy into electric signals or a light amount detection unit made of a diamond thin film that detects catoptric light and scattered light from the lens surface. In addition, in the case the output of the detection units is low, it is also effective to perform a phase-sensitive detection with the light source pulse.

Furthermore, with the exposure apparatus 10' in the second embodiment, the illumination area IAR on the reticle R is fixed. Therefore, by detecting the position of the reticle stage RST with the laser interferometer 54R, as a consequence, the positional relationship between the exposure light (energy beam) EL and the reticle R is detected. That is, the laser interferometer 54R structures the detection unit. In the case where the reticle R is stationary at a certain position, by making the fixed blind 30A have a variable structure, the positional relationship between the illumination area IAR and the reticle R, in other words, the exposure light (energy beam) EL and reticle R, can be changed. And in such a case, units such as an encoder that detects the setting position of the fixed blind 30 and the laser interferometer 54R can make up the detection unit.

The main controller 50' totally controls operations such as the synchronous scanning of the reticle R and the wafer W, the stepping of the wafer W, the exposure timing, so that the exposure is accurately performed, likewise with the main controller 50. However, with the main controller 50' the method of controlling the exposure amount differs from the main controller 50.

Figure 6:
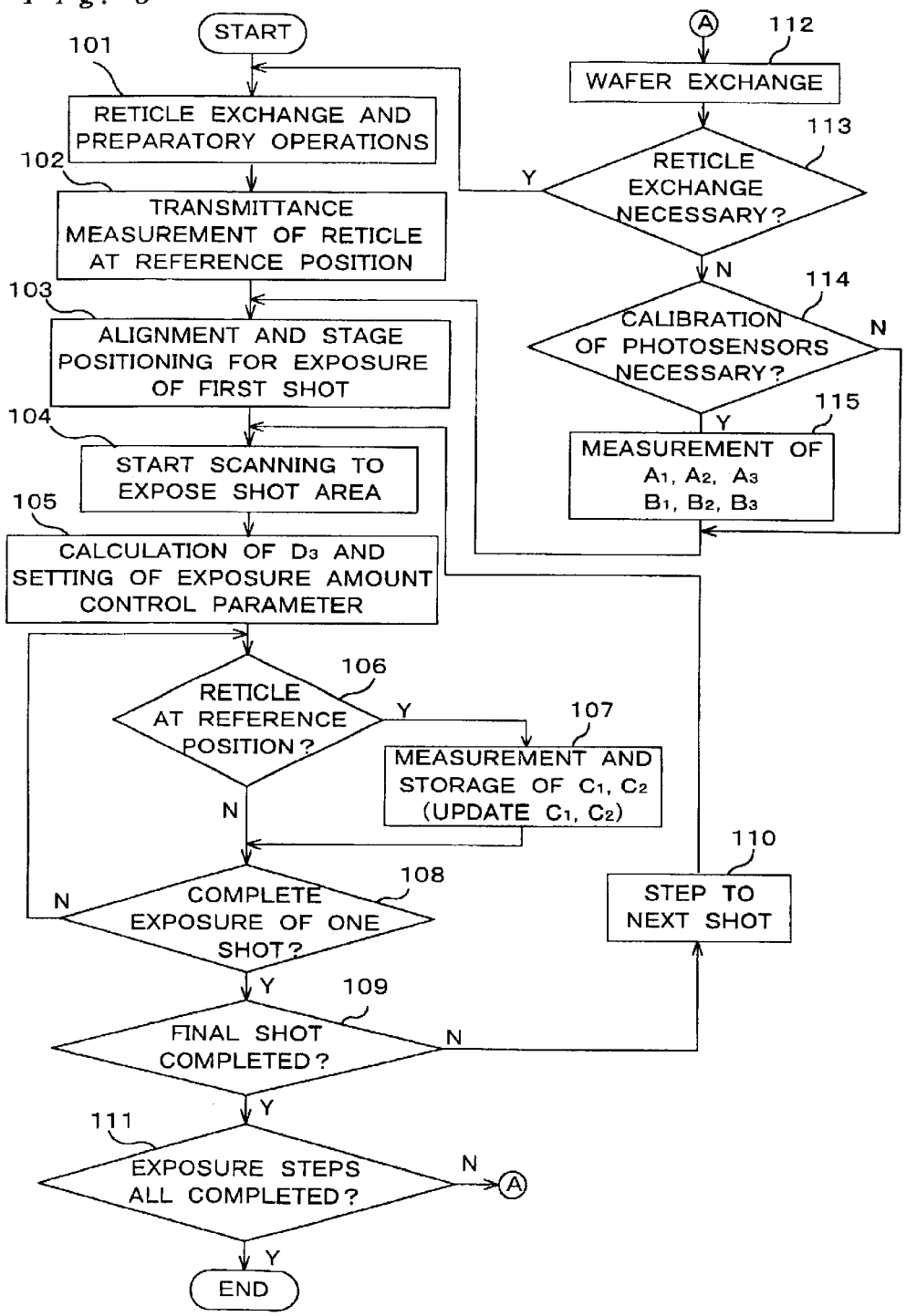
FIG. 6 is a concise flow chart showing the control algorithm of the exposure process by the main controller in FIG. 5.

The exposure processing sequence, which includes the method of controlling the exposure amount on the wafer W is described next according to a flow chart in FIG. 6 showing the control algorithm of the main controller 50', with reference to FIGS. 7A, 7B, 8A and 8B.

As a premise, the output DS of the integrator sensor 46 is to be calibrated to the reference illuminometer mounted on the image plane in advance. The output CS of the sub-integrator sensor 27 and the output of the irradiation amount monitor 59 are also to be calibrated in advance, with respect to the output DS of the integrator sensor 46 which has completed calibration. The output of the energy monitor 16c in the light source 16 is also to be calibrated to the output DS of the integrator sensor 46. Furthermore, the preset exposure amount is to be input by the operator via the input/output device (not shown in Figs.) and is to be stored in the RAM of the main controller 50'.

Then when the wafer loader (not shown in Figs.) completes the wafer loading under the control of the main controller 50', the control algorithm shown in FIG. 6 begins.

First, in step 101, the reticle is exchanged (or when there is no reticle on the stage, only loading is performed) on the reticle stage RST by the reticle loader (not shown in Figs.). Then the reticle alignment microscope, the reference mark plate on the wafer stage WST, the off-axis alignment detection system (not shown in Figs.), and the like are used in preparatory operations such as reticle alignment and baseline measurement (measurement of the distance between the detection center of the alignment detection system and the optical axis of the projection optical system). After performing the preparatory operations in predetermined procedures, the flow proceeds to step 102. Since the preparatory operations are well acknowledged, therefore details will be omitted.

In step 102, as a premise to obtain the conversion coefficient $\alpha$ (or the conversion equation to obtain the conversion coefficient $\alpha$) that is used to assume the illuminance on the image plane from the output of the integrator sensor 46 (the third energy amount) by calculation, the transmittance T of the reticle R at a predetermined reference position on the reticle stage RST is measured.

The transmittance T is measured at the reference position of the reticle R, because with the exposure apparatus 10, as was described earlier, the reticle R relatively moves with respect to the projection optical system PL. This means that the positional relationship between the reticle R and the optical axis AX frequently changes during exposure, and even if there is no change in transmittance of the optical system the detection value of the light amount monitor 27' may change due to the difference of transmittance that may occur depending on the positioning of the reticle R. Therefore, at least one reference position needs to be set, and at that position the relationship among the output of the integrator sensor 46, the light amount monitor 27', and the irradiation amount monitor 59 is to be obtained in advance. The reference position, of course, may be set at a plurality of places, however, for the sake of convenience, in the following description, the reference position will be set at one spot.

Figure 7A:
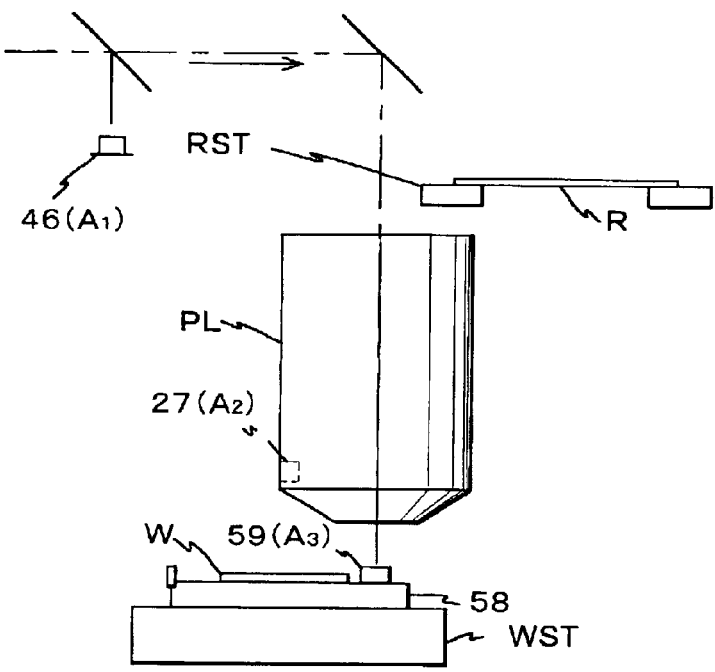
FIG. 7A and FIG. 7B are views for describing the measurement of the reticle transmittance.

With the reticle transmittance measurement in step 102, first of all, as shown in FIG. 7A, the reticle stage RST is moved so that the reticle R is withdrawn from above the projection optical system PL. Meanwhile, the wafer stage WST is also moved so that the irradiation amount monitor 59 is positioned directly under the projection optical system PL. When this is completed, a predetermined number of pulses are emitted from the light source 16 and the output of the integrator sensor 46, light amount monitor 27', and irradiation amount monitor 59 are stored in the memory 51. The output of the integrator sensor 46, light amount monitor 27', and irradiation amount monitor 59 will be referred to as $A_1$, $A_2$, and $A_3$ respectively. In this case, if a predetermined opening is formed on the reticle stage, and the exposure light from the light source can be irradiated on the projection optical system PL via the opening, the measurement described above can be performed on the light passing through the opening.

In the case where there is not enough room for sufficient movement strokes of the reticle stage RST, the integrator sensor 46, light amount monitor 27', and irradiation amount monitor 59 output can be measured at the same time prior to the reticle loading, and the measurement results can be stored as $A_1$, $A_2$, and $A_3$ in the memory 51 in advance. Or, the output of the respective sensors may be $A_1$, $A_2$, and $A_3$ when the output of the light amount monitor 27' and irradiation amount monitor 59 are calibrated in advance with respect to the output of the integrator sensor 46.

Figure 7B:
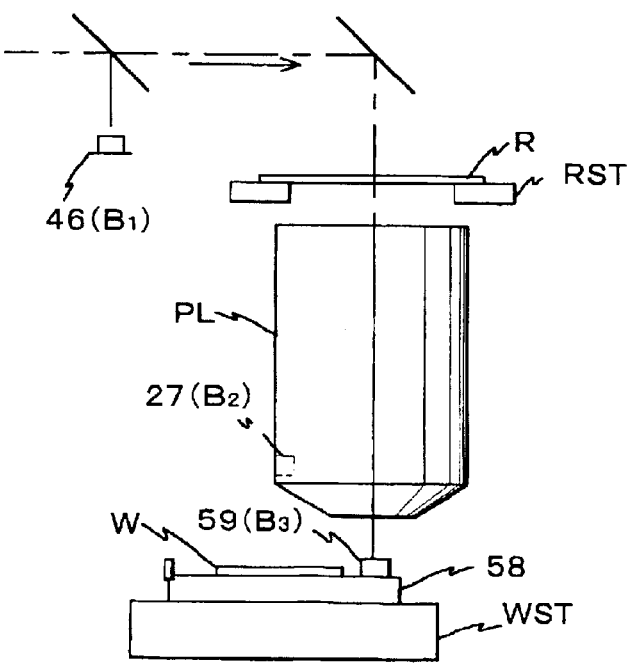

Next, the reticle stage RST is moved to an appropriate position, and the laser interferometer 54R measures the position, and stores it in the memory 51 (refer to FIG. 5), which serves as a memory unit. This measured value determined by the laser interferometer 54R and stored in the memory 51, is the predetermined reference position of the reticle R. The reference position, for the sake of simplicity, is to be the position where the center of the pattern on the reticle R coincides with the center of the field of the projection optical system PL, as shown in FIG. 7B. At this state, the wafer stage WST stays at the position directly under the projection optical system PL. Then, a predetermined number of pulses are emitted from the light source 16 and the output of the integrator sensor 46, light amount monitor 27', and irradiation amount monitor 59 are stored in the memory 51. The output of the integrator sensor 46, light amount monitor 27', and irradiation amount monitor 59 is referred to as $B_1$, $B_2$, and $B_3$ respectively. The transmittance T of the reticle, in this case, can be expressed by the following equation.

$$T = A_1 \cdot B_3 / (A_3 \cdot B_1) \tag{7}$$

While calibration is being performed, a so-called cleaning effect may occur and cause a change in the transmittance of the respective optical system. When cleaning effect occurs, moisture or organic contaminants adhered on the surface of the lenses and mirrors of the respective optical systems due to the irradiation of the exposure light EL, are removed from the surface of the optical elements by the light irradiated from the light source. Thus, to suppress this cleaning-effect at a minimum level, pulses are preferably emitted from the light source from scores per second to a level not exceeding several hundred.

Referring back to FIG. 6, in the next step 103, alignment such as EGA (enhanced global alignment) is performed using alignment detection systems not shown in Figs. The wafer stage WST is also moved, so that the XY position of the wafer W is brought to the scanning starting position of the first shot area on the wafer W. At the same time, the reticle stage RST is moved to that the XY position is brought to the scanning starting position.

Next, in step 104, relative scanning of the reticle R (the reticle stage RST) and the wafer W (the wafer stage WST) begins, in accordance with the XY position of the reticle R measured by the laser interferometer 54R and the XY position of the wafer W measured by the laser interferometer 54W. And when both stages reach the respective target scanning velocity where the velocity ratio of both stages are synchronously isochronal (synchronous setting state), the exposure light EL is irradiated on the reticle R and scanning exposure begins on the shot area subject to exposure (initially the first shot area).

After scanning exposure has begun, in step 105, the illuminance $D_3$ (refer to FIG. 8B) on the image plane is assumed by the following equation (8), on supposition that the reticle R is not loaded (arranged) on the reticle stage RST, using the output $D_1$ of the integrator sensor. The exposure amount parameter (at least one of the pulse repetition frequency, the pulse energy, the attenuation ratio, the scanning velocity, the slit width), is set in accordance with the assumed illuminance $D_3$ on the image plane and the target exposure amount set in advance. The parameter is unique to the scanning exposure apparatus.

$$D_3 = D_1 \times \alpha' \qquad (8)$$

$\alpha'$ in this case, can be expressed as shown in equation (9), by using the values stored in the memory 51. The values used are: the output $A_1$ of the integrator sensor and $A_3$ of the irradiation amount monitor which are stored at the calibration stage when the reticle is not loaded; the output $B_1$ of the integrator sensor and $B_2$ of the light amount monitor when the reticle R is at the reference position; and the output $C_1$ of the integrator sensor and $C_2$ of the light amount monitor (referred to later) stored in the memory 51 when the reticle R comes to the reference position while exposure is being performed on one shot area before.

$$\alpha' = \alpha \times (A_3/A_1) \times (B_1/B_2) \times (C_2/C_1) \qquad (9)$$

$\alpha$ is the conversion coefficient when calibrated to the output of the reference illuminometer.

For initial exposure, that is, on exposing the first shot area of the first wafer, the values $B_1$ and $B_2$ are respectively used as $C_1$ and $C_2$.

According to the equations (8) and (9), as is obvious from the fact that $(C_2/C_1)/(B_1/B_2)$ are included in equation (9), even in the case the transmittance of the projection optical system PL and the illumination optical system 12 changes, the illuminance on the image plane position (on surface of the wafer W) can be assumed almost accurately, and the exposure amount error can be suppressed at a minimum level without being affected by the change.

The reason why the illuminance $D_3$ on the image plane is obtained on supposition that the reticle R is not loaded on the reticle stage RST by the following equation (8), is because the actual exposure amount control is performed on the basis of the reticle transmittance being 100%. That is, the irradiation amount on the wafer W when the reticle R is not loaded on the reticle stage RST is the reference.

Figure 8A:
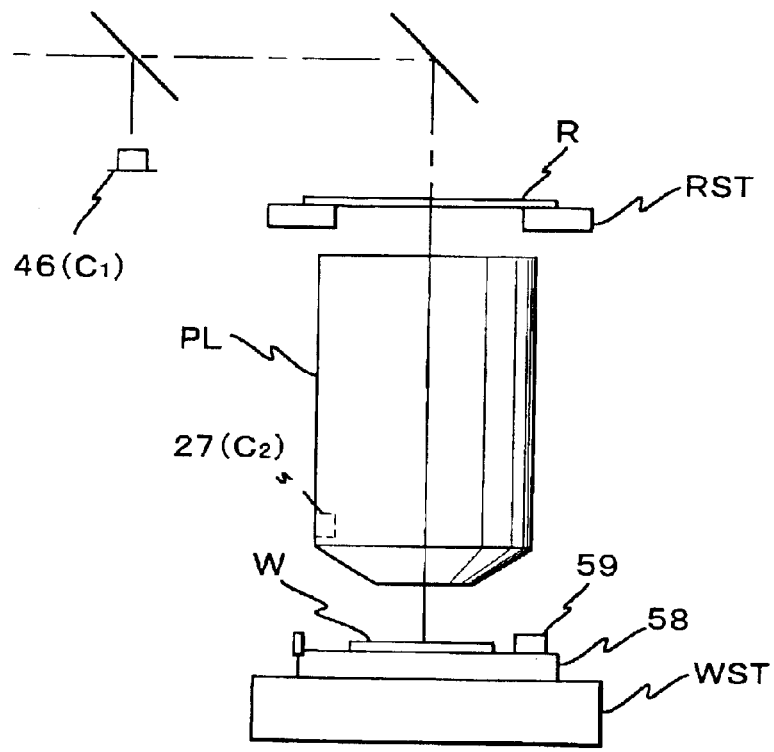
FIG. 8A is a view schematically showing the reticle positioned at the reference position.
Figure 8B:
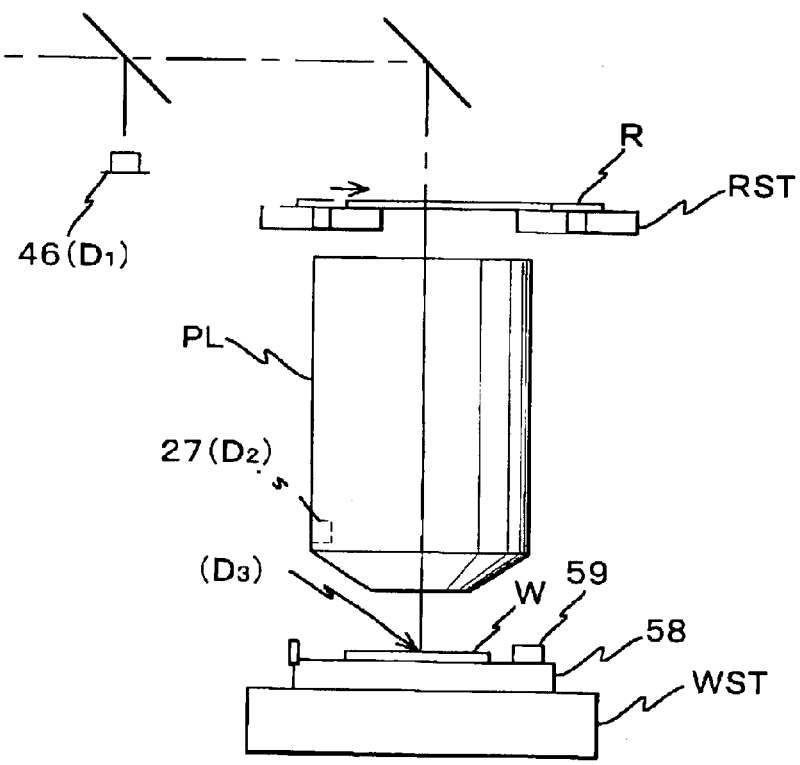
FIG. 8B is a view schematically showing the reticle positioned off the reference position.

And during scanning exposure, in step 106, judgement is made on whether the reticle R is positioned at the reference position, based on the output of the laser interferometer 54R. In the case the judgment is negative, the flow then proceeds to step 108 to judge whether the transferring of the pattern on the shot area subject to exposure has been completed. And in the case this judgement is negative, that is, transfer is still under process, then the flow returns to step 106. Meanwhile, when the judgement in step 106 is affirmative, that is, when the reticle R has reached the reference position, as is shown in FIG. 8A, the output $C_1$ of the integrator sensor 46 and $C_2$ of the light amount monitor 27' are measured and stored in the memory 51. This information is the latest update to assume the current illuminance on the wafer surface (image plane). Alternatively, the values $C_1$ and $C_2$ can be an average or a weighted average of the output $C_1$ of the integrator sensor 46 and $C_2$ of the light amount monitor 27' obtained during a plurality of exposures in the past. The updated values can be used for exposing shot areas thereafter.

Accordingly, the process and judgement in steps 106 to 108 is repeatedly performed during scanning exposure, until the judgement becomes affirmative in step 108.

When exposure on the shot area subject to exposure has been completed, the judgement turns affirmative in step 108, and proceeds to step 109, where judgement is performed on whether the exposure which has been completed is the last shot area on the wafer W. In other words, judgement is performed on whether all the shot areas on the wafer W have been exposed or not. And when this judgement is negative, the flow then proceeds to step 110 and performs stepping operation between shot areas for exposure of the next shot. The flow then returns to step 104, repeating the judgement process from step 104 to step 110 to sequentially exposure each shot area on the wafer W with the step-and-scan method while controlling the exposure amount irradiated on each point of the wafer W as described until the judgement in step 109 becomes affirmative.

When exposure on all the shot areas on the wafer W is finally completed, the flow then proceeds onto step 111. In this step, judgement is performed on whether all the exposure in the whole exposure process has been completed or not. That is, judgement is performed whether exposure on the planned slices of wafer (or the planned number of lots) has been completed or not.

In the case the judgement in step 111 is negative, the flow proceeds to step 112, and the wafer is exchanged on the wafer stage WST using the wafer loader (not shown in Figs.). The flow then goes onto step 113 and judges whether the reticle needs to be exchanged or not. If the judgement is affirmative, then the flow returns to step 101 and repeats the exposure process described above with the new reticle R.

When the judgement in step 113 is negative, and the reticle R does not have to be exchanged, the flow proceeds to step 114 where judgement is performed on whether calibration of the relationship of the output among the integrator sensor 46, light amount monitor 27', and irradiation monitor 59 is necessary. The calibration is necessary because although the image plane illuminance during scanning exposure can be practically precisely assumed without being affected by the change in transmittance of the projection optical system PL or illumination optical system 12, it is a mere assumption and not the actual measurement. Therefore, by performing calibration on the relationship of the output among the integrator sensor 46, light amount monitor 27', and irradiation monitor 59 (that is measuring the transmittance of the exposure optical path) the error due to assumption can be corrected.

The criteria to judge whether the calibration is necessary, can be set at for example, after completing exposure on a predetermined number of wafers, or when the transmittance variation amount (to the initial value) monitored based on the ratio of the output of the integrator sensor 46 and light amount monitor 27' exceeds a predetermined amount. And the calibration intervals do not necessarily have to be even, for example, when the temporal change of the transmittance variation predicted is great, the calibration interval may be set short, whereas when the change is small, then the interval may be long.

The judgement on whether the calibration above is to be performed when the wafer is exchanged, may be performed automatically by the main controller 50' in accordance with the transmittance change with reference to the set value input to the main controller 50' in advance by an operator. Or, it may be instructed manually by the operator, in accordance with the transmittance of the exposure path monitored during exposure, which is shown on devices such as displays at all times.

When calibration is judged necessary in the step 114 above, the flow then proceeds to step 115 and performs similar operations as of when the transmittance of the reticle is measured. That is, the reticle stage RST is moved so that the reticle R is withdrawn from the optical path. The integrator sensor 46, light amount monitor 27', and irradiation amount monitor 59 output are measured at the same time again, and the measurement results $A_1$, $A_2$, and $A_3$ are updated and stored in the memory 51. The reticle stage RST is then moved again so that the reticle R is brought to the reference position. The integrator sensor 46, light amount monitor 27', and irradiation amount monitor 59 output are measured at the same time, and the results $B_1$, $B_2$, and $B_3$ are updated and stored in the memory 51. The calibration is thus performed.

That is, in this embodiment, the main controller 50' simultaneously measures the light amount (energy amount) of the exposure light EL by using the integrator sensor 46, light amount monitor 27', and irradiation amount monitor 59. The main controller also as materialize a calibration unit, which repeats calibration on the relationship of the output among the respective sensors based on the measurement results at a predetermined timing.

And when calibration is judged not necessary in step 114, then the flow directly goes on to step 103 skipping the procedures in step 115.

As is described, until it is judged in step 111 that all the process on exposure has been completed in the exposure process the exposure operation above is repeated, and finally when the judgement is affirmative, the series of process in this routine is completed.

With the exposure apparatus 10' according to the second embodiment, as is described in detail, the main controller 50' measures the transmittance of the reticle R at the reference position (refer to step 102 in FIG. 6). When this measurement is performed, the reticle R is positioned at the reference position, and the measurement value $B_1$, $B_2$ and the detection value of the laser interferometer 54R is stored in the memory 51. The measurement value $B_1$ is the measurement result of the integrator sensor 46 measuring the light amount of the exposure light EL which passes through the inside of the illumination system 12 (the first energy amount). $B_2$ is the measurement result of the light amount monitor 27' measuring the light amount of the exposure light EL which passes through the inside of the projection optical system (the second energy amount), and the laser interferometer 54R detects the position of the reticle stage RST (reticle R). Then during scanning exposure, the main controller 50' monitors the measured value $D_1$ of the integrator sensor 46, and the image plane illuminance $D_3$ is be assumed by the equations (8) and (9) based on the monitored results and the values $B_1$ and $B_2$ stored in the memory 51. And in accordance with the assumption results and the target exposure amount set in advance, the parameter for exposure amount control is set (refer to step 105 in FIG. 6), thus the exposure amount provided on the wafer W is controlled.

The change in transmittance of the exposure light EL in the optical path between the integrator sensor 46 and the surface of the wafer W (image plane) is practically precisely reflected in the normalized value obtained by dividing the measurement value of the light amount monitor 27' by the measurement value of the integrator sensor 46. Accordingly, in this embodiment, the measurement value of the light amount monitor 27' (and the measurement value of the integrator sensor 46) is used to adjust the exposure energy (exposure amount) provided on the wafer W when the main controller 50' assumes the image plane illuminance based on the measurement value of the integrator sensor 46. As a consequence, an exposure amount control with high precision suppressing the influence of the change in transmittance of the exposure light EL in the optical path becomes possible, which in turn allows exposure with high precision.

In this embodiment, prior to starting the scanning exposure of the first shot area on the wafer W, the main controller 50' reads and stores the measurement results of the integrator sensor 46 and the light amount monitor 27', and the detection results of the laser interferometer 54R. Therefore, the amount of the transmittance change in the optical system is small enough to bypass, allowing a more highly precise exposure amount control.

In addition, in this embodiment, even when the pattern is being transferred onto the wafer W the integrator sensor 46 and the light amount monitor 27' can detect the light amount (energy amount) of the exposure light EL (refer to step 107 in FIG. 4). This allows an accurate monitoring of the transmittance change of the exposure light EL in the optical path from the integrator sensor 46 to the image plane to some extent. Therefore, a more precise exposure amount control becomes possible, compared with the case when the exposure amount is controlled based on a prediction of the transmittance change. Furthermore, the frequency of transmittance measurements of the exposure optical path using the irradiation amount monitor 59 can be reduced, which leads to an overall increase in throughput during the whole exposure process. Accordingly, the influence of the transmittance change in the optical system can be suppressed, and as a consequence, exposure with high precision and high throughput can be achieved.

Also, when the reticle R comes to the reference position each time the respective shot areas on the wafer W are exposed, the integrator sensor 46 and the light amount monitor 27' measure the light amount of the exposure light EL. By using the measured results, the measurement values of the integrator sensor 46 and the light amount monitor 27' stored in the memory 51 are updated (refer to step 107 in FIG. 6). And based on this update, the assumption of the image plane illuminance and setting of the parameter on exposure amount control for exposing the next shot area can be performed, therefore, even when scanning exposure is repeatedly performed on each shot area of the wafer W, the exposure amount can be controlled with high precision with the influence of the transmittance change in the optical system suppressed. Furthermore, since the update of the measured values of the integrator sensor 46 and light amount monitor 27 stored in the memory 51 is performed during scanning exposure, this cannot be the cause of reducing the throughput. This update of the measured values of the integrator sensor 46 and light amount monitor 27, as a matter of course, does not necessarily have to be performed during scanning exposure.

In addition, the main controller 50' can calibrate the relationship of the measured values among the respective sensors (46, 27', and 59) (refer to step 114 and 115 in FIG. 6). Therefore, the assumption errors of the illuminance on the image plane made from the measurement value of the integrator sensor 46 can be corrected, and allows a more precise exposure amount control. These assumption errors occur over a long period of time, and cannot be corrected in accordance with the relationship of the light amount detection results of the integrator sensor 46 and light amount monitor 27'.

Furthermore, when the light source is an energy beam having a short wavelength, in order to prevent the energy from being absorbed in the atmosphere, an inert gas (a low absorptive gas) is purged in the optical path to the energy beam. To keep the inert gas from deteriorating or losing its uniformity, or to reduce adverse effects on the transmittance that cannot be predicted, the exposure method (the exposure amount control method) related to this embodiment is effective.

With the second embodiment, as the second photosensor, the light monitor 27' has been arranged near the lower end of the projection optical system PL. However, the present invention is not limited to this, and can be arranged in other places so long as it has a structure that can detect the energy amount of the exposure light which passes through at least a part of the inner portion of the projection optical system. Even in such a case, the change in transmittance of the optical path between the first photosensor (the integrator sensor 46) and the second photosensor can be monitored by the method described above in the embodiment. Therefore, exposure amount control is possible with high precision compared with the case when the exposure amount is controlled on the premise that the transmittance is fixed or when the change in transmittance is predicted.

In the second embodiment above, the case is described when the measured values of the integrator sensor 46 and light amount monitor 27' stored in the memory 51' is updated in accordance with the values measured when the reticle R is set at the reference position. However, the present invention is not limited to this, that is, the relationship of the output of the integrator sensor 46 and light monitor 27' can be corrected otherwise. For example, the reticle R maybe set at a position different from the reference position. And the measured values of the integrator sensor 46 and light amount monitor 27' stored in the memory 51' may be updated in accordance with the measurement results of the light amount of the exposure light EL measured simultaneously by the integrator sensor 46 and the light amount monitor 27' as well as the transmittance of the reticle R at the position set when the measurement is performed. The transmittance is the correlation value of the incident/outgoing energy amount corresponding to the reticle R position. As with this case, the exposure light EL is measured simultaneously by the integrator sensor 46 and the light amount monitor 27' to update the measured values stored in the memory 51' with the exposure light EL irradiating an area on the reticle R different from when the simultaneous measurement of the integrator sensor 46 and the light amount monitor 27' corresponding to the stored values was performed. When updating the measured values stored in the memory 51', the transmittance corresponding to the area where the exposure light EL is irradiated on the reticle R is used. Therefore, as a consequence, even if, for example, the transmittance on the reticle R differs depending on position, this allows the measured values of the integrator sensor 46 and the light amount monitor 27' to be revised with high precision without being affected by the difference. In this case, as well, the revision of the measured data may, or may not be performed during scanning exposure.

In this case, the transmittance of the reticle R, may be actually measured as described above while gradually changing the position of the reticle R. However, with a reticle made of a glass substrate which has a chromium pattern and the like formed, the reticle transmittance can be determined accurately to some extent by the designed distribution of the chromium pattern, so these transmittance values may also be used.

In addition, as is described in each embodiment, the case when a transmittance type reticle is used as the mask is described, however, the present invention is not limited to this. The present invention may be suitably applied to an exposure apparatus using a reflection type mask (reticle) as the mask. In this case, the reflectance of the mask corresponds to the correlation value of the incident/outgoing energy amount.

Furthermore, in the second embodiment, the light source 16 can be made to emit light before performing calibration measurements of the integrator sensor 46, light amount monitor 27', and the irradiation amount monitor 59 prior to the reticle loading. By doing so, ultraviolet light is irradiated on the illumination optical system 12 and projection optical system arranged between the light source 16 and image plane (wafer setting portion), making it possible to remove the contaminants adhered on the optical elements prior to the pattern transfer on the wafer. And by sufficiently performing this irradiation to remove the contaminants from the optical elements, the transmittance change during exposure operations caused by the contaminants can be reduced. The irradiation, in this case, is a pulse laser beam emitted from the light source, the pulse around one to a hundred thousand.

Also, according to the second embodiment, the change in the impurity level of the gas filling the optical path and the change in transmittance caused by the construction materials of the optical elements such as lenses that have an adverse effect on the exposure amount control and cannot be prevented by the prior irradiation alone, can be corrected by using the light amount monitor 27' of the projection optical system PL.

In addition, with the reticle, since there is a possibility that there may be organic contaminants or vapor on a newly loaded reticle, in the sequence described above, prior to measuring the transmittance of the reticle R, the exposure light can be irradiated onto the reticle. With this irradiation, the contaminants adhered on the reticle can be removed so that the transmittance can be improved, thus is possible to reduce the change in the transmittance during exposure. It is preferable for this light amount to be a pulse laser beam, likewise, around one to a hundred thousand emitted from the light source. This irradiation can be performed each time the wafer is exchanged, prior to exposure.

When the transmittance of the illumination optical system and projection optical system changes during this irradiation on the reticle, it becomes difficult to measure the accurate transmittance of the reticle. Therefore, when performing this irradiation on the reticle the transmittance of the illumination optical system and projection optical system need to be stabilized to some extent, by irradiating the illumination optical system and projection optical system beforehand without the reticle fixed.

Furthermore, this irradiation on the reticle can be suitably applied to not only to the exposure apparatus related to the present invention (and the embodiment), but also to the conventional exposure apparatus that does not have a light amount monitor in the projection optical system.

In addition, this irradiation on the reticle can be performed while the reticle is being transferred. In this case, an ultraviolet light irradiating mechanism including a light source such as an ultraviolet lamp can be arranged in the reticle transferring system.

As is described in each embodiment above, in the present invention the illumination light EL for exposure is a laser beam, such as an ArF excimer laser beam (wavelength: 193 nm) or a $F_2$ laser beam (wavelength: 157 nm). However, the present invention is not limited to this, and this invention can be suitably applied to an exposure apparatus that uses a harmonic, obtained by amplifying a single-wavelength laser beam in the infrared or visible range being emitted by a DFB semiconductor laser or fiber laser with a fiber amplifier doped with erbium (or both erbium and ytteribium), and converting the wavelength into ultraviolet light using a nonlinear optical crystal as the illumination light EL for exposure.

If, for example, the oscillation wavelength of a single-wavelength laser is set within the range of 1.51 to 1.59 μm, an eighth-harmonics whose generation wavelength falls within the range of 189 to 199 nm or a tenth-harmonics whose generation wavelength falls within the range of 151 to 159 nm is output. If the oscillation wavelength is set in the range of 1.544 to 1.553 μm, in particular, an eighth-harmonics whose generation wavelength falls within the range of 193 to 194 nm, i.e., ultraviolet light having almost the same wavelength as that of an ArF excimer laser beam, can be obtained. If the oscillation wavelength is set within the range of 1.57 to 1.58 μm, a tenth-harmonics whose generation wavelength falls within the range of 157 to 158 nm, i.e., ultraviolet light having almost the same wavelength as that of an $F_2$ laser beam, can be obtained.

If the oscillation wavelength is set within the range of 1.03 to 1.12 μm, a seventh-harmonics whose generation wavelength falls within the range of 147 to 160 nm is output. If the oscillation wavelength is set within the range of 1.099 to 1.106 μm, in particular, a seventh-harmonics whose generation wavelength falls within the range of 157 to 158 μm, i.e., ultraviolet light having almost the same wavelength as that of an $F_2$ laser beam, can be obtained. In this case, as a single-wavelength oscillation laser, for example, an ytteribium-doped fiber laser can be used.

Furthermore, in the first embodiment, the case is described when the present invention is applied to a scanning exposure apparatus based on a step-and-scan method. However, the present invention is not limited to this, and the first exposure apparatus and the exposure method can be suitably applied to a static type exposure apparatus such as steppers.

The exposure apparatus 10 and 10' described in the embodiment in the present invention, can be made by incorporating the illumination optical system made of a plurality of lenses and the projection optical system into the main body of the exposure apparatus while performing optical adjustment. The reticle stage and wafer stage structured of many mechanical parts are attached to the main body of the exposure apparatus, the wiring and piping connected, and then finally overall adjustment (electric adjustment, optical alignment, operation checks, and the like) is performed. The exposure apparatus of the present invention is made by assembling various subsystems including elements defined in the claims of the present application so as to keep a predetermined mechanical precision, electrical precision, and optical precision. In order to ensure these areas of precision, various optical systems, various mechanical systems, and various electrical systems are adjusted to attain a predetermined optical precision, mechanical precision, and electrical precision, respectively, prior to and after the assembly. The process of incorporating various subsystems into an exposure apparatus includes mechanical connection of various subsystems, by wiring electrical circuits, piping pressure circuits, and the like. Obviously, before the process of incorporating various subsystems into an exposure apparatus, the process of assembling the respective subsystem is performed. After the process of assembling various subsystems into the exposure apparatus, total adjustment is performed to ensure preciseness in the overall exposure apparatus. The exposure apparatus is preferably made in a clean room in which temperature, degree of cleanliness, and the like are controlled.

And, in addition to an exposure apparatus used to manufacture semiconductor devices, obviously, the present invention can be applied to an exposure apparatus that transfers a device pattern onto a glass plate, which are used to manufacture displays including liquid crystal display devices. It also can be applied to an exposure apparatus to transfer a device pattern onto a ceramic wafer, which is used to manufacture thin-film magnetic heads, an exposure apparatus used to manufacture image sensing devices (CCDs and the like), micromachines, and DNA chips, and the like. Furthermore, the present invention can be applied to an exposure apparatus for transferring a circuit pattern onto a glass substrate, silicon wafer, or the like to manufacture a reticle or mask. The reticle and mask are used in an apparatus such as an optical exposure apparatus, an EUV (Extreme UltraViolet) exposure apparatus, an X-ray exposure apparatus, an electron beam exposure apparatus, and the like, as well as to an exposure apparatus manufacturing microdevices such as a semiconductor element.

<<Device Manufacturing Method>>

A device manufacturing method using the exposure apparatus 10 and 10' and exposure method in the embodiment in a lithographic process will next be described in detail.

Figure 9:
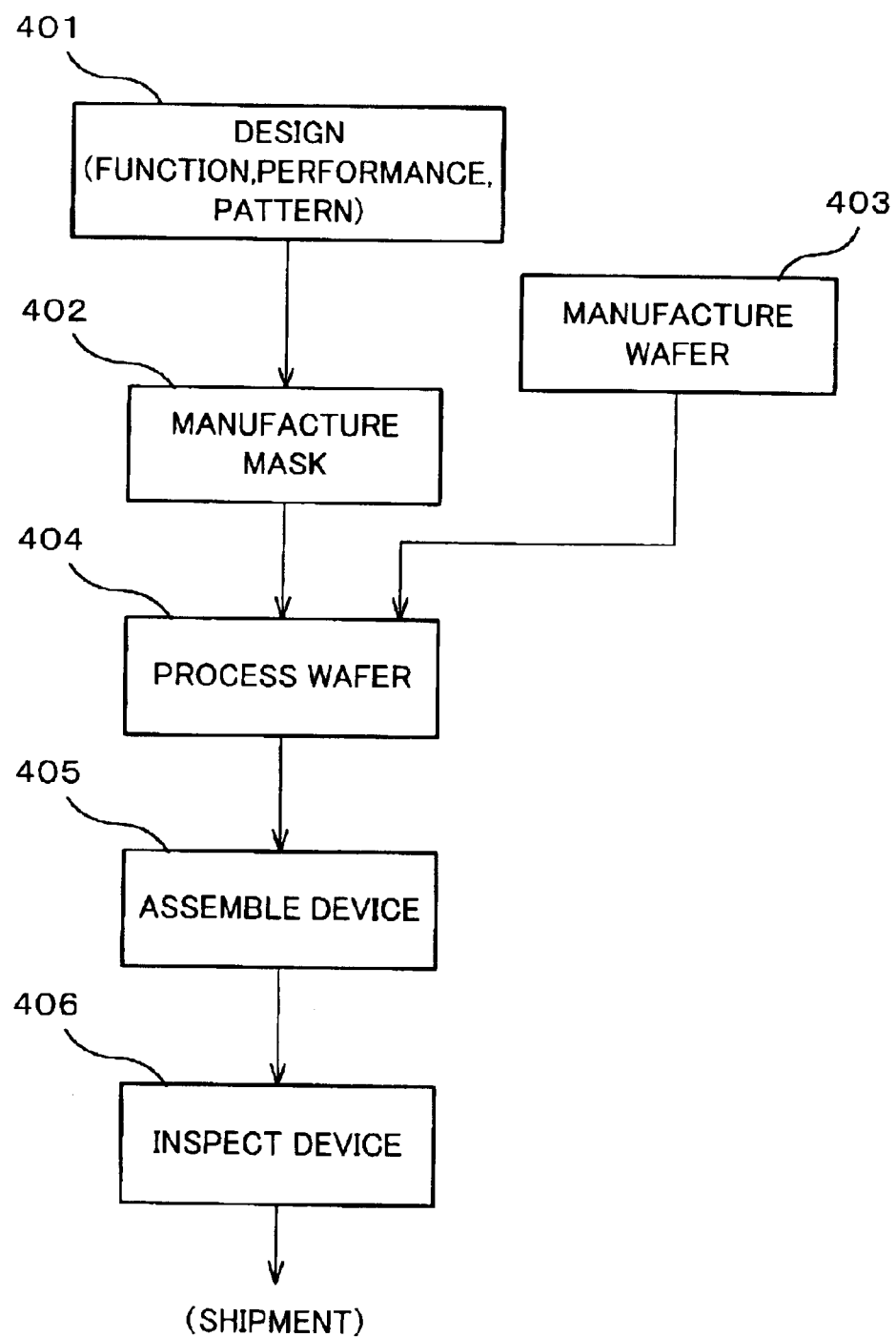
FIG. 9 is a flow chart for explaining an embodiment of a device manufacturing method according to the present invention.

FIG. 9 is a flowchart showing an example of manufacturing a device (a semiconductor chip such as an IC or LSI, a liquid crystal panel, a CCD, a thin magnetic head, a micromachine, or the like). As shown in FIG. 9, in step 401 (design step), function/performance is designed for a device (e.g., circuit design for a semiconductor device) and a pattern to implement the function is designed. In step 402 (mask manufacturing step), a mask on which the designed circuit pattern is formed is manufactured. In step 403 (wafer manufacturing step), a wafer is manufacturing by using a silicon material or the like.

In step 404 (wafer processing step), an actual circuit and the like is formed on the wafer by lithography or the like using the mask and wafer prepared in steps 401 to 403, as will be described later. In step 405 (device assembly step), a device is assembled by using the wafer processed in step 404. Step 405 includes processes such as dicing, bonding, and packaging (chip encapsulation).

Finally, in step 406 (inspection step), a test on the operation of the device, durability test, and the like are performed. After these steps, the device is completed and shipped out.

Figure 10:
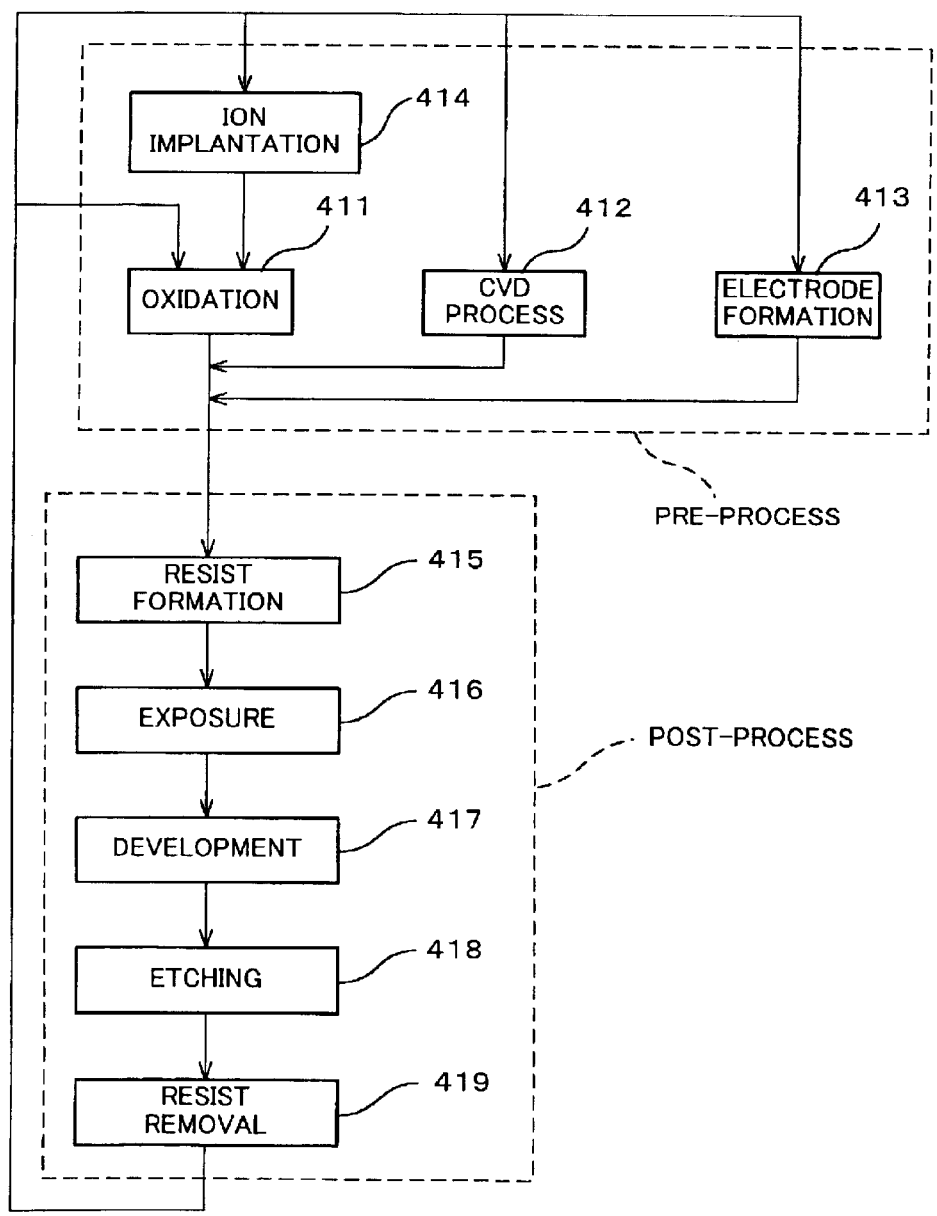
FIG. 10 is a flow chart showing the processing in step 404 in FIG. 9.

FIG. 10 is a flow chart showing a detailed example of step 404 described above in manufacturing the semiconductor device. Referring to FIG. 37, in step 411 (oxidation step), the surface of the wafer is oxidized. In step 412 (CVD step), an insulating film is formed on the wafer surface. In step 413 (electrode formation step), an electrode is formed on the wafer by vapor deposition. In step 414 (ion implantation step), ions are implanted into the wafer. Steps 411 to 414 described above constitute a pre-process for the respective steps in the wafer process and are selectively executed in accordance with the processing required in the respective steps.

When the above pre-process is completed in the respective steps in the wafer process, a post-process is executed as follows. In this post-process, first, in step 415 (resist formation step), the wafer is coated with a photosensitive agent. Next, as in step 416, the circuit pattern on the mask is transcribed onto the wafer by the above exposure apparatus and method. Then, in step 417 (developing step), the exposed wafer is developed. In step 418 (etching step), an exposed member on a portion other than a portion where the resist is left is removed by etching. Finally, instep 419 (resist removing step), the unnecessary resist after the etching is removed.

By repeatedly performing these pre-process and post-process steps, multiple circuit patterns are formed on the wafer.

As described above, by using the device manufacturing method of this embodiment, the exposure apparatus and exposure method described in each embodiment above are used in the exposure process (step 416). This makes it possible to perform exposure with high precision, without the uniformity being uneven due to defocus, which in turn can improve the productivity (including yield) when manufacturing devices having high integration.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure method for illuminating a mask having a pattern with an energy beam via an illumination optical system and forming an image of the pattern on a substrate via a projection optical system, said exposure method comprising:

monitoring a first energy amount of said energy beam within said illumination optical system;

monitoring a second energy amount of said energy beam within said projection optical system while transferring the image of said pattern onto said substrate; and controlling an energy amount provided to said substrate in accordance with results of said monitoring said first and second energy amounts.

2. An exposure method according to claim 1, said method further comprising:

detecting a third energy amount of said energy beam irradiated on an image plane of said projection optical system almost simultaneously with said first and second energy amount; and repeating calibration of a conversion coefficient to convert a result of said first energy amount into an energy amount provided on said image plane during exposure at a predetermined timing in accordance with results of said detecting.

3. An exposure method according to claim 2, wherein said third energy amount is detected on a receiving surface of a photosensor arranged within a plane including an image plane of said projection optical system.

4. An exposure method according to claim 3, wherein said calibration is performed after said pattern is transferred onto a predetermined number of substrates.

5. An exposure method according to claim 1, wherein said second energy amount is monitored in accordance with catoptric light and scattered light from a surface of an optical element which structures said projection optical system.

6. An exposure method according to claim 1, wherein said second energy amount is monitored in accordance with expansion or contraction of an optical element which structures said projection optical system caused by absorption of said energy beam.

7. An exposure method for illuminating a mask having a pattern with an energy beam via an illumination optical system and forming an image of the pattern on a substrate via a projection optical system by synchronously moving said mask and said substrate, said exposure method comprising:

measuring a first energy amount of said energy beam within an illumination optical path from said light source to said mask by using a first photosensor;

measuring a second energy amount of said energy beam within said projection optical system by using a second photosensor, when said mask and said energy beam have a predetermined positional relationship and while transferring the image of said pattern onto said substrate; and transferring said mask pattern onto said substrate by adjusting an energy provided to said substrate based on measurement values of said first and second photosensors.

8. An exposure method according to claim 7, said method further comprising:

measuring said second energy amount of said energy beam by said second photosensor which positional relationship between said mask and said energy beam is identical as of when said second energy amount is previously measured, wherein a result of said measuring is used to update said measurement value of said second photosensor which is used in said transfer of said mask pattern.

9. An exposure method according to claim 8, wherein said measurement value of said second photosensor is updated when said mask and said substrate are moving.

10. An exposure method according to claim 9, wherein said measurement value of said second photosensor is updated by using a weighted average value of said measurement value of said second photosensor, said weighted average value being obtained from a plurality of exposures performed most recently.

11. An exposure method according to claim 7, said method further comprising:

setting a positional relationship between said mask and said energy beam which differs from when said second energy amount is previously measured, and measuring said second energy amount of said energy beam by said second photosensor, wherein said measurement value of said second photosensor which is used to transfer said mask pattern is updated in accordance with a result of said measuring said second energy amount and a correlation value of an incident/outgoing energy amount of said mask which corresponds to a positional relationship between said mask and said energy beam at the time of said measuring said second energy amount.

12. An exposure method according to claim 11, wherein said measurement value of said second photosensor is updated when said mask and said substrate are moving.

13. An exposure method according to claim 12, wherein said measurement value of said second photosensor is updated by using a weighted average value of said measurement value of said second photosensor, said weighted average value being obtained from a plurality of exposures performed most recently.

14. An exposure method according to claim 7, wherein a conversion coefficient to assume an illuminance on an image plane is corrected based on a measurement value of said first photosensor in consideration of a measurement value of said second photosensor when adjusting said energy provided on said substrate.

15. An exposure method according to claim 7, said method further comprising:
    measuring said first energy amount of said energy beam by using said first photosensor;
    measuring said second energy amount of said energy beam by using said second photosensor; and
    measuring a third energy amount of said energy beam irradiated on an image plane of said projection optical system by using a third photosensor;
    wherein said measuring by said first, second, and third photosensors are performed simultaneously at a predetermined timing.

16. An exposure apparatus for illuminating a mask having a pattern with an energy beam via an illumination optical system and forming an image of the pattern on a substrate via a projection optical system, said exposure apparatus comprising:
    a first photosensor which is provided within said illumination optical system and detects an energy amount of said energy beam;
    a second photosensor which is arranged within said projection optical system, and detects an energy amount of said energy beam during exposure, said energy beam having passed through at least a portion of said projection optical system; and
    an exposure amount control unit which controls an exposure amount provided to said substrate during said exposure in accordance with detection results of said first and second photosensors.

17. An exposure apparatus according to claim 16, wherein said exposure amount control unit corrects a conversion coefficient to convert a detection result of said first photosensor into said energy amount provided to said substrate in accordance with said detection results of said first and second photosensors.

18. An exposure apparatus according to claim 16, wherein said second photosensor is arranged on an image plane side of said projection optical system within said projection optical system.

19. An exposure apparatus according to claim 18, wherein said second photosensor is attached to an optical element in the vicinity of an image plane of said projection optical system, and includes a piezoelectric element which generates acoustic signals in accordance with the expansion and contraction of the optical element.

20. An exposure apparatus according to claim 16, wherein a low absorptive gas is purged in an optical path of said energy beam, said optical path from said light source to a surface of said substrate.

21. An exposure apparatus according to claim 16, wherein said energy beam is a beam in a vacuum ultraviolet region having a wavelength not exceeding 200 nm.

22. An exposure apparatus according to claim 16, wherein said second photosensor detects a portion of said energy beam which passes through between said projection optical system and said substrate.

23. An exposure apparatus for illuminating a mask having a pattern with an energy beam and forming an image of the pattern on a substrate while synchronously moving said mask and said substrate, said exposure apparatus comprising:
    a light source which emits said energy beam;
    an illumination optical system which is arranged between said light source and said mask, and irradiates said energy beam from said light source onto said mask;
    a projection optical system which is arranged between said mask and said substrate, and projects said energy beam outgoing from said mask onto an image plane;
    a first photosensor which is provided within said illumination optical system, and measures an energy amount of said energy beam;
    a second photosensor which is provided within said projection optical system, and measures an energy amount of said energy beam while transferring the image of said pattern onto said substrate; and
    a control unit which is connected to said first and second photosensors, and adjusts an energy amount provided to said substrate during synchronous movement of said mask and said substrate based on measurement values of said first and second photosensors.

24. An exposure apparatus according to claim 23, said exposure apparatus further comprising:
    a detection unit which is connected to said control unit and detects a positional relationship between said mask and said energy beam when said energy amount is detected by said second photosensor; and
    a storage unit which is connected to said second photosensor and stores a measurement value of said second photosensor used to adjust said energy amount;
    wherein said control unit sets a positional relationship of said mask and said energy beam to said positional relationship detected by said detection unit in accordance with a detection result of said detection unit, reads a measurement value measured by said second photosensor, and updates said measurement value of said second photosensor stored in said storage unit.

25. An exposure apparatus according to claim 24, wherein said control unit updates said measurement value of said second photosensor when said mask and said substrate are moving.

26. An exposure apparatus according to claim 25, wherein said control unit updates said measurement value of said second photosensor by using a weighted average value of said measurement value of said second photosensor, said weighted average value being obtained from a plurality of exposures performed most recently.

27. An exposure apparatus according to claim 23, said exposure apparatus further comprising:
    a detection unit which is connected to said control unit and detects a positional relationship between said mask and said energy beam when said energy amount is detected by said second photosensor; and
    a storage unit which is connected to said second photosensor and stores a measurement value of said second photosensor used to adjust said energy amount;
    wherein said control unit sets a positional relationship between said mask and said energy beam which differs from a positional relationship previously detected by said detection unit, reads a measurement value measured by said second photosensor, and updates said measurement value of said second photosensor stored in said storage unit in accordance with said measurement value read by said control unit and a correlation value of an incident/outgoing energy amount of said mask which corresponds to a positional relationship between said mask and said energy beam when said measurement value is read.

28. An exposure apparatus according to claim 27, wherein said control unit updates said measurement value of said second photosensor when said mask and said substrate are moving.

29. An exposure apparatus according to claim 28, wherein said control unit updates said measurement value of said second photosensor by using a weighted average value of said measurement value of said second photosensor, said weighted average value being obtained from a plurality of exposures performed most recently.

30. An exposure apparatus according to claim 23, wherein said control unit corrects a conversion coefficient to assume an illuminance on an image plane, based on a measurement value of said first photosensor in consideration of a measurement value of said second photosensor when said energy provided on said substrate is adjusted.

31. An exposure apparatus according to claim 23, said exposure apparatus further comprising:
a third photosensor which has a receiving surface arranged on an image plane of said projection optical system, and measures an energy amount of said energy beam irradiated on an image plane of said projection optical system at a time other than exposure; and
a calibration unit which is connected to said first, second and third photosensors, and repeatedly measures an energy amount of said energy beam by said first, second, and third photosensors simultaneously and calibrates a relationship of measured values among said photosensors at a predetermined timing.

32. An exposure apparatus according to claim 31, wherein at least one of said first, second and third photosensors has a cover glass made of fluorine doped quartz where said energy beam passes through and a photodetection element which receives said energy beam having passed through said cover glass.

33. An exposure apparatus according to claim 23, wherein a low absorptive gas is purged in an optical path of said energy beam, said optical path from said light source to a surface of said substrate.

34. An exposure apparatus according to claim 23, wherein said energy beam is a beam in a vacuum ultraviolet region having a wavelength not exceeding 200 nm.

35. A method of making an exposure apparatus which transfers a pattern formed on a mask onto a substrate, said method comprising:
providing an illumination optical system which irradiates an energy beam on said mask;
providing a projection optical system which projects said energy beam outgoing from said mask onto said substrate;
providing a first photosensor within said illumination optical system which detects an energy amount of said energy beam;
providing a second photosensor within said projection optical system which detects an energy amount of said energy beam while transferring the image of said pattern onto said substrate; and
providing an exposure amount control unit which controls an exposure amount provided to said substrate during exposure in accordance with detection results of said first and second photosensors.

36. A method of making an exposure apparatus which energy beam irradiates a mask having a pattern formed and which transfers said pattern onto a substrate while synchronously moving said mask and said substrate, said method comprising:
providing a light source which emits said energy beam;
providing an illumination optical system which irradiates said energy beam from said light source onto said mask;
providing a projection optical system which projects said energy beam outgoing from said mask onto an image plane;
providing a first photosensor within said illumination optical system which measures an energy amount of said energy beam;
providing a second photosensor within said projection optical system which measures an energy amount of said energy beam while transferring the image of said pattern onto said substrate; and
providing a control unit which adjusts an energy amount provided to said substrate during synchronous movement of said mask and said substrate based on measurement values of said first and second photosensors.

37. A method of making an exposure apparatus according to claim 36, said method further comprising:
providing a third photosensor which measures an energy amount of said energy beam irradiated on an image plane of said projection optical system at a time other than exposure; and
providing a calibration unit which repeatedly measures an energy amount of said energy beam by said first, second, and third photosensors simultaneously and a relationship of measured values among said photosensors at a predetermined timing.

38. A device manufacturing method including a lithographic process, wherein
a device pattern is transferred onto a substrate by using said exposure method according to claim 1.

39. A device manufacturing method including a lithographic process, wherein
a device pattern is transferred onto a substrate by using said exposure method according to claim 7 in said lithographic process.

40. A device manufacturing method including a lithographic process, wherein
exposure is performed by using said exposure apparatus according to claim 16 in said lithographic process.

41. A device manufacturing method including a lithographic process, wherein
exposure is performed by using said exposure apparatus according to claim 23 in said lithographic process.

* * * * *